US012584981B2

(12) United States Patent
Siaw

(10) Patent No.: US 12,584,981 B2
(45) Date of Patent: Mar. 24, 2026

(54) INDUCTIVE TUNING WITH A SLIDING BAND CAPACITOR IN A LOW TEMPERATURE NUCLEAR MAGNETIC RESONANCE PROBE AND METHODS OF USE

(71) Applicant: JEOL LTD., Tokyo (JP)

(72) Inventor: Anthony Ting Ann Siaw, Rowley, MA (US)

(73) Assignee: JEOL LTD., Tokyo (JP)

( * ) Notice: Subject to any disclaimer, the term of this patent is extended or adjusted under 35 U.S.C. 154(b) by 172 days.

(21) Appl. No.: 18/599,758

(22) Filed: Mar. 8, 2024

(65) Prior Publication Data

US 2025/0283960 A1 Sep. 11, 2025

(51) Int. Cl.
*G01R 33/36* (2006.01)
*G01R 33/31* (2006.01)

(52) U.S. Cl.
CPC ......... *G01R 33/3628* (2013.01); *G01R 33/31* (2013.01)

(58) Field of Classification Search
CPC ............... G01R 33/3628; G01R 33/31; G01R 33/56536; G01R 33/34092; G01R 33/3635
See application file for complete search history.

(56) References Cited

U.S. PATENT DOCUMENTS

| | | |
|---|---|---|
| 3,789,832 A | 2/1974 | Damadian |
| 4,301,410 A | 11/1981 | Wind |
| 4,398,149 A | 8/1983 | Zens |
| 4,517,516 A | 5/1985 | Hill |

(Continued)

FOREIGN PATENT DOCUMENTS

| | | |
|---|---|---|
| JP | 2008154933 A | 12/2006 |
| WO | WO2007/020537 | 2/2007 |

(Continued)

OTHER PUBLICATIONS

Bowyer, P. et al., "Using magnetic 1-25 coupling to implement1H,19F,13C experiments in routine high resolution NMR probes", Journal Magnetic Resonance, vol. 261, (2015) , pp. 190-198.

(Continued)

*Primary Examiner* — G.M. A Hyder

(74) *Attorney, Agent, or Firm* — SCI-LAW STRATEGIES, PC

(57) ABSTRACT

In various embodiments of the invention, a cooled-NMR probe can utilize a non-tapered sliding band capacitor which can be moved relative to the inner conducting skirt of a parent coil to adjust the inductance of the parent coil and thereby the frequency of the parent coil to allow the parent coil to detect the resonance of at a nucleus without requiring leads between the parent coil and a lock coil. The cooled-NMR probe can be provided without the disadvantages of prior art cooled-NMR probes. In an embodiment of the invention, the sliding band capacitor comprises a diamagnetic insulator with a first volume magnetic susceptibility, at least one paramagnetic metal with a second volume magnetic susceptibility and at least one diamagnetic metal with a third volume magnetic susceptibility, where the sum of the first volume magnetic susceptibility, the second volume magnetic susceptibility and the third volume magnetic susceptibility is approximately zero.

20 Claims, 14 Drawing Sheets

(56) References Cited

U.S. PATENT DOCUMENTS

| | | | |
|---|---|---|---|
| 4,549,136 | A | 10/1985 | Zens |
| 4,609,872 | A | 9/1986 | O'Donnell |
| 4,654,592 | A | 3/1987 | Zens |
| 4,654,593 | A | 3/1987 | Ackerman |
| 4,751,465 | A | 6/1988 | Zens |
| 4,833,412 | A | 5/1989 | Zens |
| 4,947,120 | A | 8/1990 | Frank |
| 5,003,265 | A | 3/1991 | Leussler |
| H1218 | H | 8/1993 | Cory |
| 5,243,289 | A | 9/1993 | Blum |
| 5,483,163 | A | 1/1996 | Wen |
| 7,064,549 | B1 * | 6/2006 | Hudson .............. G01R 33/3628 |
| | | | 324/318 |
| 7,088,102 | B1 | 8/2006 | Zens |
| 7,106,063 | B1 | 9/2006 | Zens |
| 7,352,185 | B1 | 4/2008 | Zens |
| 7,557,578 | B1 | 7/2009 | Zens |
| 7,570,059 | B2 | 8/2009 | Greim |
| 8,063,639 | B2 | 11/2011 | Zens |
| 10,241,063 | B2 | 3/2019 | Zens |
| 10,241,165 | B2 | 3/2019 | Zens |
| 10,620,282 | B2 | 4/2020 | Zens |
| 10,656,107 | B2 | 5/2020 | Zens |
| 10,908,239 | B1 | 2/2021 | Zens |
| 12,422,508 | B1 * | 9/2025 | Zens .................... G01R 33/307 |
| 2001/0033165 | A1 | 10/2001 | Tomanek |
| 2009/0160442 | A1 | 6/2009 | Mazurkewitz |
| 2009/0237077 | A1 | 9/2009 | Vaughan |
| 2010/0156414 | A1 | 6/2010 | Sakellariou |
| 2010/0164645 | A1 | 7/2010 | Kobayashi |
| 2010/0256569 | A1 | 10/2010 | Cachemaille et al. |
| 2011/0025326 | A1 | 2/2011 | Zens |
| 2014/0057792 | A1 | 2/2014 | Brey |

FOREIGN PATENT DOCUMENTS

| | | |
|---|---|---|
| WO | WO2010/018535 | 2/2010 |
| WO | WO2013/108142 | 7/2013 |
| WO | WO2016179523 | 11/2016 |

OTHER PUBLICATIONS

Hoult, D.I., et al., "Use of Mutually Inductive Coupling in Probe Design", Concepts in Magnetic Resonance (Magnetic Resonance Engineering), vol. 15, (2002), pp. 262-285.

Hoult, D.I., et al., "Dual Surface Coil with High-B1 Homogeneity for deep organ MR Imaging", Magnetic Resonance Imaging, vol. 15, (1997), pp. 1199-1204.

King et al., MR Spectroscopy Using Multi=Ring Surface Coils, vol. 42 (1999) 655-664.

Kuhns PL et al., "Inductive coupling and tuning in NMR probes; Applications", Journal Magnetic Resonance, vol. 78, (1988), pp. 69-76.

Taber, B. Using Magnetic Coupling to Improve the 1H/2H Double Tuned Circuit, J. Magn. Reson. 259 (2015) 114-120.

Tang, J .A. et al., Practical aspects of liquid-state NMR with inductively coupled solenoid coils, Magnetic Resonance in Chemistry, Jul. 27, 2010, (wileyonlinelibrary.com) DOI 10.1002/mrc. 2651.

Van Hecke P, et al., "Double-Tuned Resonator Designs for NMR Spectroscopy", Journal Magnetic Resonance, vol. 84, (1989), pp. 170-176.

International Search Report, PCT/IB2016/000730, dated Nov. 11, 2016, 15 pages.

International Search Report, PCT/JP2017/000178, dated Oct. 17, 2017, 11 pages.

EPO Examination Report 16731648.8, regional phase in Europe of PCT/IB2016/000730, dated Apr. 24, 2018, 8 pages.

EPO Communication Art 94(3) EPC for Application No. 16731648. 8, dated Nov. 15, 2018, 10 pages.

EPO Communication Art 94(3) EPC for Application No. 17719932. 0, dated Jan. 14, 2019, 8 pages.

EPO Communication Art 94(3) EPC for Application No. 17719932. 0, dated Jul. 1, 2020, 6 pages.

Japanese Office Action for Application No. 2017-553891, dated Oct. 9, 2018, 4 pages.

English translation of Japanese Office Action for Application No. 2017-553891, dated Oct. 9, 2018, 3 pages.

Japanese Office Action for Application No. 2018-526823, dated Mar. 11, 2019, 3 pages.

English translation of Japanese Office Action for Application No. 2018-526823, dated Mar. 11, 2019, 2 pages.

Chinese Office Action for Application No. 201680034553.6, dated Jul. 2, 2019, 7 pages.

English translation of Chinese Office Action for Application No. 201680034553.6, Jul. 2, 2019, 3 pages.

Chinese Office Action for Application No. 201680034553.6, dated Jun. 3, 2020, 7 pages.

English translation of Chinese Office Action for Application No. 201680034553.6, dated Jun. 3, 2020, 4 pages.

Chinese Office Action for Application No. 2017800041535.5, dated Nov. 25, 2019, 6 pages.

English translation of Chinese Office Action for Application No. 2017800041535.5, dated Nov. 25, 2019, 3 pages.

Chinese Office Action for Application No. 2017800041535.5, dated Jun. 22, 2020, 6 pages.

English translation of Chinese Office Action for Application No. 2017800041535.5, dated Jun. 22, 2020, 4 pages.

* cited by examiner

230

210

213

213

211

214

230

210

5012

213

INDUCTIVE TUNING WITH A SLIDING BAND CAPACITOR IN A LOW TEMPERATURE NUCLEAR MAGNETIC RESONANCE PROBE AND METHODS OF USE

RELATED APPLICATIONS

The present invention is related to an application (i) filed on Mar. 8, 2024, by inventor: Albert Zens, and entitled "Sliding Band Capacitor Inductive Coupling in a Low Temperature Nuclear Magnetic Resonance Probe and Methods of Use", and (ii) U.S. application Ser. No. 17/896,416, filed Aug. 26, 2022, which issued on Aug. 15, 2023 as U.S. Pat. No. 11,726,152, which applications (i)-(ii) are hereby incorporated by reference in their entireties and for all purposes.

FIELD OF THE INVENTION

The present invention relates to methods and devices to monitor one or more nuclei in high resolution nuclear magnetic resonance probes utilizing radio frequency signals.

BACKGROUND OF THE INVENTION

Structural elucidation of a compound, whether a synthesis product or an extract from a natural source generally requires a number of analytical techniques. Infrared spectroscopy, mass spectrometry, and Nuclear Magnetic Resonance (NMR) spectroscopy can provide extensive chemical information. NMR can provide structural information and also information on both intermolecular and intramolecular dynamics. Applications of NMR range from determination of three-dimensional structures of large proteins to the analysis of very small amounts of products from combinatorial syntheses. Furthermore, NMR is a nondestructive analytical method.

NMR generally uses induction to detect the oscillating magnetic moment from nuclei precessing in a magnetic field. Because the signal from these precessing nuclei is inherently weak research efforts have been focused on improving the signal to noise ratio (SNR) obtained in NMR experiments. There are two general ways to increase the SNR. One way is to increase the size of the magnetic field. While more powerful magnets, are increasingly being employed, currently superconducting magnets with up to 1.2 GHz are commercially available, there is an upper limit of the critical field of a superconducting magnet. The other way is to decrease the noise by cooling the coils and electronics used to detect the signal.

High resolution NMR probes typically have an 'inner coil' for irradiation and detection of a first nuclear species, and a second larger coil, coaxial with the inner coil, for irradiation of one or more other nuclear species. The two coils are typically oriented 90° with respect to each other to minimize coupling between the two coils. Capacitive coupling has previously been used to form double-tuned high resolution NMR probes for $^1$H-$^2$H, $^{13}$C-$^{15}$N and $^1$H-$^{19}$F.

The magnetic coupling loops, coupling resonators, variable tuning capacitors, pulse field gradients, Faraday shields and loop gap shields can all be detrimental to the performance of the probe in some manner. The RF homogeneity of the parent coil can be impacted by the presence of additional metallic objects and the presence of magnetic coupling loops or resonators that couple to the sample inductor. All of the above, shields, coupling loops, variable capacitors, resonators, pulse field gradients etc., can dilute the SNR of the NMR experiment even if only in a minor manner. From the above it can be deduced that the fewer the number of objects in the sample region of the NMR probe the better the SNR.

In U.S. Pat. No. 4,654,593 to Ackerman, a method for NMR imaging uses a nonmagnetic moving object positioned in the field of a Radio Frequency (RF) excitation coil and a magnetic field where the object is of a low conductivity so as to be substantially transparent to electromagnetic radiation at the NMR frequency and the nonmagnetic object is subjected to periodic motion while transverse magnetization is generated, and a short duration phase-encoding magnetic field gradient pulse is applied in a specified direction to the moving nonmagnetic object, where the magnetic field gradient is turned off and a free induction decay signal is detected. In U.S. Pat. No. 5,227,724 to Cory et al., a method for measuring the distribution of the extent of molecular transport along two orthogonal directions, and further for measuring the anisotropy of molecular transport is disclosed. In U.S. Statutory Invention Registration. No. H1218 to Cory et al., a method of NMR imaging where spatial coupling of the sample with a receiver device is varied using pulsed magnetic field gradients and the sample is moved relative to the receiver device, or the spatial coupling of the receiver device and the sample is electronically altered, is disclosed. Kuhns et al. describe the use of inductive coupling for series linked tuning of resonant circuits, J. Magnetic Resonance, "Inductive Coupling and Tuning in NMR Probes: Applications", 78 (1988) 69-76. Hoult and Tomanek describes the use of mutually inductive coils and investigates field strength, losses and signal to noise ratio, "Use of Mutually Inductive Coupling in probe Design", Concepts in Magnetic Resonance, 15 (4) (2002) 262-285, Wiley Periodicals, Inc.

SUMMARY OF THE INVENTION

A limitation of using a variable capacitor with associated leads to adjust the parent coil resonance is that the leads can act as inductors and thereby reduce the amplitude of the parent coil flux. The limitation can be addressed by using a sliding band capacitor in which the variable capacitor with associated leads is eliminated. In an embodiment of the present invention, the performance of cooled NMR probes with a low inductance coil that have high Q values can be improved by incorporating a sliding band capacitor moved relative to a non-tapered skirt to adjust the parent coil resonance. A further limitation is that such a sliding band capacitor can be used to change the capacitance but the inductance of the parent coil can change only slightly (unless the parent coil is exchanged for a different inductance coil). In an embodiment of the present invention, the performance of a probe can be improved by incorporating a sliding band capacitor moved relative to a non-tapered skirt to adjust the inductance of the parent coil.

BRIEF DESCRIPTION OF THE DRAWINGS

This invention is described with respect to specific embodiments thereof. Additional aspects can be appreciated from the Figures in which.

DETAILED DESCRIPTION OF THE INVENTION

Definitions

Figure 1:
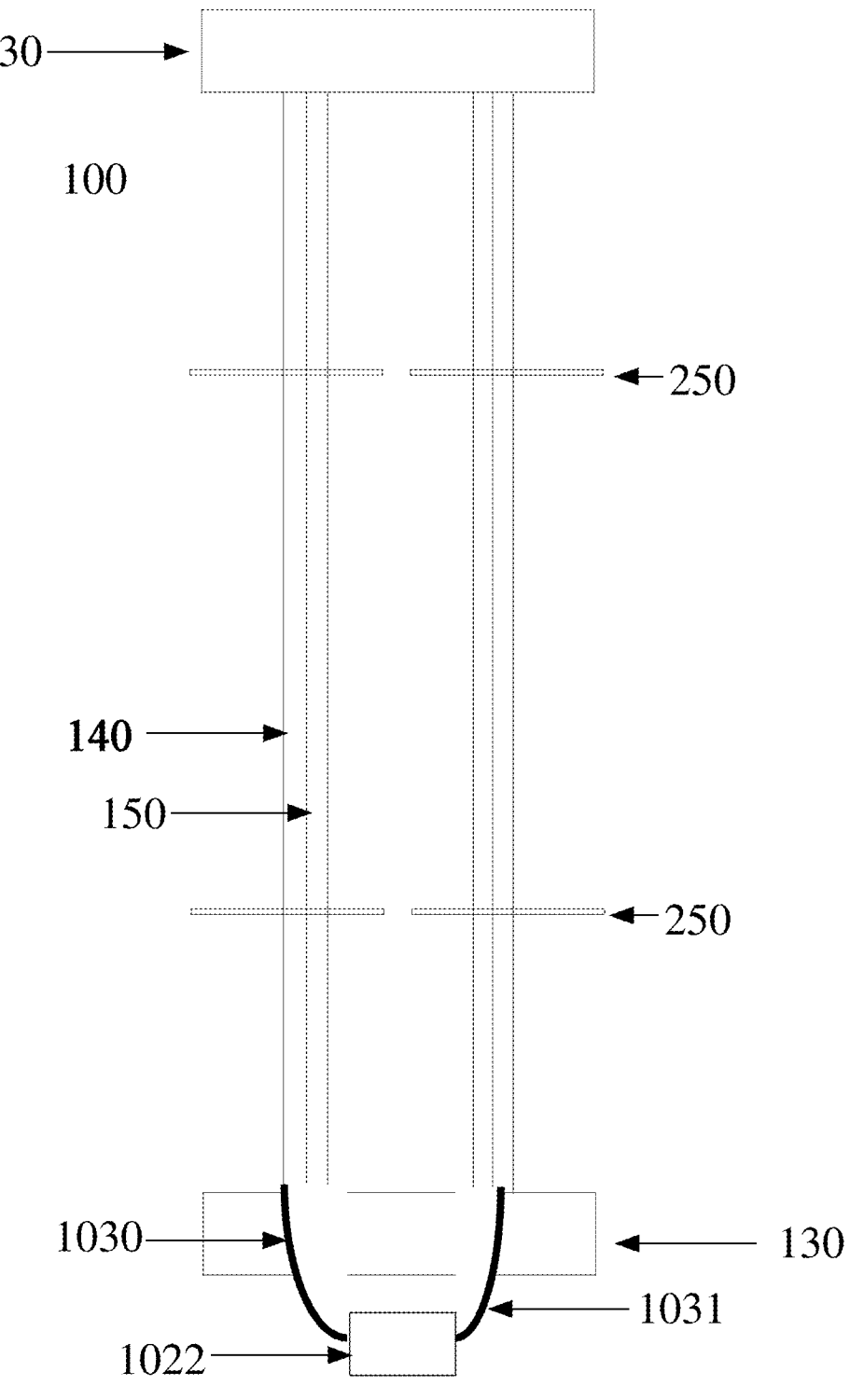
FIG. 1 is a schematic diagram of a prior art probe, where leads 1030, 1031 connect a variable capacitor 1022 to a parent coil.

The transitional term 'comprising' is synonymous with 'including', 'containing', or 'characterized by', is inclusive or open-ended and does not exclude additional, unrecited elements or method steps.

The transitional phrase 'consisting of' excludes any element, step, or ingredient not specified in the claim, but does not exclude additional components or steps that are unrelated to the invention such as impurities ordinarily associated with a composition.

The transitional phrase 'consisting essentially of' limits the scope of a claim to the specified materials or steps and those that do not materially affect the basic and novel characteristic(s) of the claimed invention.

The phrase 'the NMR instrument' includes the magnet field characteristics of the NMR, e.g., the maximum magnet field intensity. The phrase 'the NMR probe' includes the size characteristics of the low temperature probe.

The Quality Factor (Q) is defined as the ratio of the energy stored in a component to the energy dissipated by the component. The unloaded Q ($Q_u$) is the measured Q without the load.

The phrases 'low temperature probe', 'ultra-low temperature probe', 'cryo-cooled probe', 'liquid nitrogen cooled probe', or 'low temperature cryo-cooled probe', mean an NMR probe that is adapted to be cooled to be used at temperatures below approximately 100° K. In this circumstance, approximately means plus or minus twenty (20) percent.

A thin foil is approximately cuboid and contains six surfaces of which four (4) of the surfaces are referred to as edges and two (2) of the surfaces are referred to as faces.

The term 'opposing edge' when used to refer to two articulated edges (each having approximately the same dimensions and area) means the edges formed (when the foil is adapted to form a ring) are in close proximity and/or touching. The term 'opposing face' when used to refer to two articulated faces means the faces are in close proximity and/or touching. In this circumstance, approximately means plus or minus five (5) percent tolerance.

The word 'exposed' means an edge or a face of a metal that otherwise is not covered. Two opposing edges of a metal are not exposed. That is a titanium foil has an exposed top edge, an exposed bottom edge and two exposed faces, see FIG. 2.

The phrase 'exposed edges of a ring' of a paramagnetic metal foil ring refers to the top edge and the bottom edge. The phrase 'exposed faces of a ring' of a paramagnetic metal foil ring refers to the two faces.

A 'paramagnetic metal ring' means a paramagnetic metal foil adapted to form the top edge, the bottom edge and the two faces. A thin foil that is adapted to form a ring retains a rectangular cross section, see FIG. 2.

A 'face is aligned with another face' when each face has the same dimensions and area as an opposing face, and the face meets the opposing face such that the two faces are touching over approximately the area of the two faces. In this circumstance, approximately means plus or minus ten (10) percent tolerance.

A 'face of a foil ring' of a paramagnetic metal foil ring means the largest area of the foil and excludes the two opposing edges, the top edge and the bottom edge. A 'surface of a titanium foil ring' means largest area of the foil and excludes the two opposing edges, the top edge and the bottom edge. In a titanium foil with dimensions 41.32 mm×10 mm×60 μm, the surface area of the side of a titanium foil ring is $4.13×10^{-4}$ m$^2$.

A 'top edge of a foil ring' of a paramagnetic metal foil ring means the edge of the ring that is closest to the spacer plates 250. A 'top edge of a titanium foil ring' means the edge of the ring that is closest to the spacer plates 250. In a titanium foil with dimensions 41.32 mm×10 mm×60 μm, the surface area of the top edge of a titanium foil ring is $1.0495×10^{-6}$ m$^2$.

A 'bottom edge of a foil ring' of a paramagnetic metal foil ring means the edge of the ring that is furthest from the spacer plates 250. A 'bottom edge of a titanium foil ring' means the edge of the ring that is furthest from the spacer plates 250. In a titanium foil with dimensions 41.32 mm×10 mm×60 μm, the surface area of bottom edge of a titanium foil ring is $1.0495×10^{-6}$ m$^2$.

An 'optimal Q value' means a theoretically calculated Q value of a paramagnetic metal foil ring aligned with a diamagnetic metal foil in which 100 percent of the exposed edges and exposed faces of the paramagnetic metal surface area are covered with the diamagnetic metal.

Figure 10A:
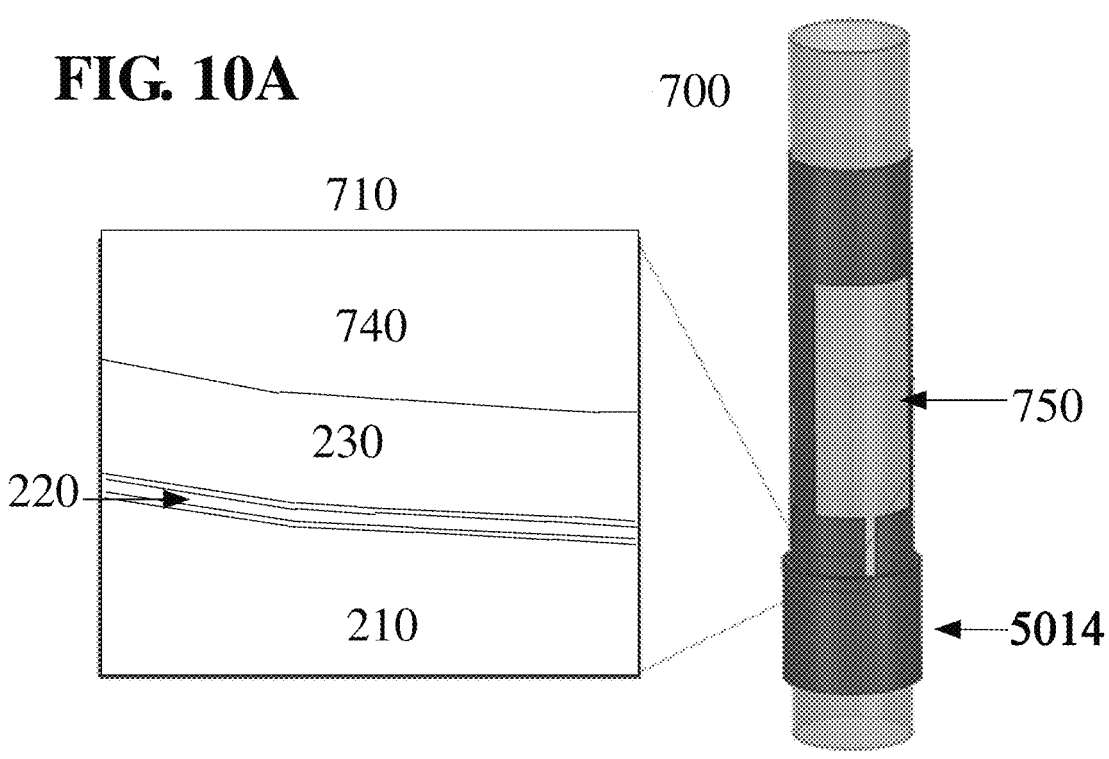
FIG. 10A is a schematic diagram of a probe in which the sliding band capacitor 5014 with a rectangular coil window 750 in which a titanium foil has an unfolded tri layer (i.e., an exposed top edge of a titanium foil) and the sliding band capacitor 5014 is below the rectangular coil window 750 resulting in a Q @ 500 MHz of 893.8, where 710 shows a zoom of a region between the non-tapered skirt 740 and the sliding band capacitor 5014, according to an embodiment of the invention.
Figure 10B:
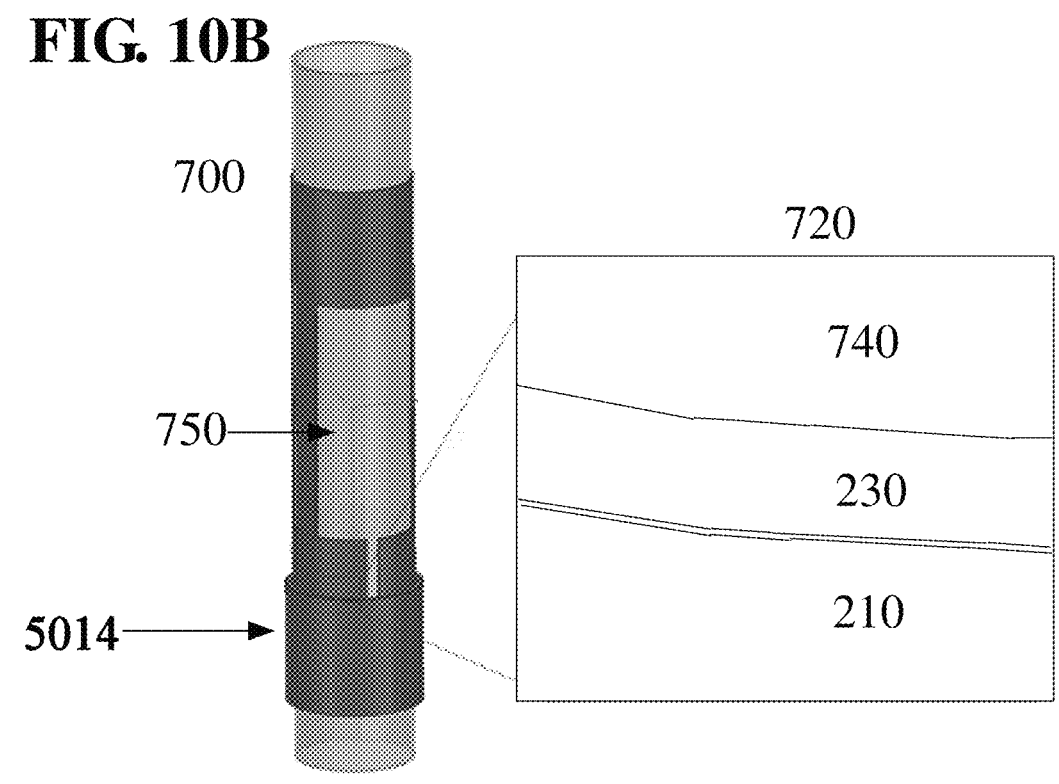
FIG. 10B is a schematic diagram of a probe in which the sliding band capacitor 5014 with a rectangular coil window 750 in which a titanium foil has a folded tri layer and the sliding band capacitor 5014 is below the rectangular coil window 750 resulting in a Q @ 500 MHz of 1069.2, where 720 shows a zoom of a region between the non-tapered skirt 740 and the sliding band capacitor 5014, according to an embodiment of the invention.

A 'paramagnetic metal foil ring is enclosed by a diamagnetic metal' means a paramagnetic metal foil ring aligned with a diamagnetic metal foil such that the measured Q value is greater than approximately ninety-five (95) percent of the optimal Q value. For example, a titanium foil ring is enclosed by copper when approximately ninety-nine (99) percent the surface area of the top edge of a titanium foil ring is approximately aligned with a copper surface and approximately ninety-nine (99) percent the surface area of the side of a titanium foil ring is approximately aligned with a copper surface. In this circumstance, approximately means plus or minus one (1) percent. Unexpectedly, for a titanium ring sliding band capacitor 5014 positioned below the rectangular coil window 750, exposing the top edge of the titanium foil has a dramatic effect on the Q value, e.g., FIG. 10A shows that the Q @ 500 MHz drops to 893.8 compared with FIG. 10B with a Q @ 500 MHz of 1069.2 (calculations based on coil ID=10 mm, sapphire thickness 0.4 mm, copper foil thickness 25.4 μm, and titanium foil is 41.32 mm×10 mm×60 μm). In contrast, exposing the bottom titanium ring edge of a sliding band capacitor 5014 positioned below the rectangular coil window 750 has a minimal effect on the Q value. This is because when the sliding band capacitor 5014 is positioned below the rectangular coil window 750, most of the current flows in the top edge and not in the bottom edge of the titanium ring. However, we note that exposing the bottom titanium ring edge of a sliding band capacitor 5014 positioned above the rectangular coil window 750 will have a significant effect, while exposing the bottom edge of a titanium ring sliding band capacitor 5014 positioned above the rectangular coil window 750 has a minimal effect on the Q value. This is because when the sliding band capacitor 5014 is positioned above the rectangular coil window 750, most of the current flows in the bottom edge and not in the top edge of the titanium ring. We also note that the non-tapered skirt 740 would need to be inverted in order for the sliding band capacitor 5014 to effectively function when positioned above the rectangular coil window 750. In the zoom 710 in FIG. 10A the top edge of the titanium 220 is exposed between the sapphire 230 and the copper 210 (the non-tapered skirt 740 is adjacent the sapphire 230). In the zoom 720 in FIG. 10B the sapphire 230 is sandwiched between the non-tapered skirt 740 and the copper 210.

A 'paramagnetic metal foil ring is surrounded by a diamagnetic metal' means a paramagnetic metal foil ring aligned with a diamagnetic metal foil such that the measured Q value is greater than approximately ninety (90) percent of the optimal Q value. For example, a titanium foil ring is surrounded by copper when approximately ninety-nine (99) percent the surface area of the top edge of a titanium foil ring is approximately aligned with a copper surface and approximately ninety-five (95) percent the surface area of the side of a titanium foil ring is approximately aligned with a copper surface. In this circumstance, approximately means plus or minus one (1) percent.

A 'paramagnetic metal foil ring is contacted by a diamagnetic metal' means a paramagnetic metal foil ring aligned with a diamagnetic metal foil such that the measured Q value is greater than approximately eighty (80) percent of the optimal Q value. For example, a titanium foil ring is contacted by copper when approximately ninety-nine (99) percent the surface area of the top edge of a titanium foil ring is approximately aligned with a copper surface and approximately ninety (90) percent the surface area of the side of a titanium foil ring is approximately aligned with a copper surface. In this circumstance, approximately means plus or minus one (1) percent.

A titanium metal alloy means titanium alloyed with one or more metals, where the titanium composition is greater than eighty (80) percent. In this circumstance, approximately means plus or minus twenty (20) percent. In an alternative embodiment of the invention, titanium metal alloy means titanium alloyed with one or more metals, where the titanium composition is greater than ninety (90) percent. In this circumstance, approximately means plus or minus ten (10) percent. In another alternative embodiment of the invention, a titanium metal alloy means titanium alloyed with one or more metals, where the titanium composition is greater than ninety-five (95) percent. In this circumstance, approximately means plus or minus five (5) percent. In a further alternative embodiment of the invention, a titanium metal alloy means titanium alloyed with one or more metals, where the titanium composition is greater than ninety-eight (98) percent. In this circumstance, approximately means plus or minus one (1) percent.

In an embodiment of the invention, a sliding band capacitor has a sum volume magnetic susceptibility of less than approximately $1 \times 10^{-6}$ such that the Q is maximized. In an alternative embodiment of the invention, a sliding band capacitor has a sum volume magnetic susceptibility of less than approximately $5 \times 10^{-7}$ such that the Q is maximized. In an alternative embodiment of the invention, a sliding band capacitor has a sum volume magnetic susceptibility of less than approximately $1 \times 10^{-7}$ such that the Q is maximized. In these circumstances, approximately means plus or minus ten (10) percent.

The phrase 'high conductance metal' means a conductance of greater than approximately $2 \times 10^7$ S/m at 20° C. In this circumstance, approximately means plus or minus $1 \times 10^7$ S/m at 20° C. The conductance's of some suitable diamagnetic metals are given in Table I.

The phrase 'low inductance probe' means a probe with a parent coil inductance of less than approximately $1 \times 10^{-7}$ H. In this circumstance, approximately means plus or minus twenty (20) percent.

The phrase 'stable paramagnetic metal' means a paramagnetic metal that is not readily oxidized at approximately 300° K and/or approximately 100° K and/or that undergoes radioactive decay. The properties of some suitable stable paramagnetic metals are given in Table II.

The phrase 'radioactive decay' means an element that loses energy through radiation, e.g., undergoes one or more of alpha decay, beta decay, gamma decay and/or neutron decay. For example, all elements of atomic number 83 or greater undergo radioactive decay.

The word 'deployed' means attached, affixed, adhered, inserted, located or otherwise associated.

A 'cell' means a vessel used to contain one or more of a homogeneous or heterogeneous liquid, gas or solid sample.

A 'parent circuit' means the circuit comprising the parent coil 5010 and sliding band capacitor 5014.

Coupling to various coils of different sizes and functions can be used to optimize the circuit. A parent coil, a coupling coil, a lock coil, and a detector coil can be solenoidal coils.

The word 'excitation' describes the disruption of the alignment of spins of nuclei in a sample in a static magnetic field ($B_0$) which occurs by applying an RF pulse at the Larmor frequency of the spins perpendicular to the magnetic field ($B_1$).

The word 'performance' means the SNR of a circuit with respect to the parent mode(s).

The word 'mode' means a resonance in the circuit.

The words or phrases 'coupling', 'coupling modes', 'detecting' or 'detecting modes' means selecting the sliding band capacitor 5014 and adjusting the resonance frequency by moving the position of the sliding band capacitor 5014 relative to the parent coil 5010. The critical coupling is necessary for matching the resistance to a fifty (50) Ohm coax. In various embodiments of the invention, the resistance can be matched to other resistance coax. In an embodiment of the invention, the resistance can be coupled to seventy-five (75) Ohm coax. In various embodiments of the invention, seventy-seven (77) Ohm coax gives minimum loss.

The phrases 'parent coil' or 'sample coil' means the inductor constructed to observe the parent resonance. Elements 140 (copper rods), 250 (plates) and 740 (non-tapered skirt) comprise the parent coil 5010. The non-tapered skirt 740 comprises a material selected from the group consisting of Cu, Cu plated with Pd, or a Cu Al Cu. The movement of the sliding band capacitor 5014, relative the non-tapered skirt changes the inductance of the parent coil 5010 and can be used to tune the parent coil 5010 to a specific frequency.

The phrase 'sample coupling coil' refers to an inductive coil 3087, 3088. A sample coupling coil can be used for detecting the fluctuating signal that is in resonance with a signal from a sample. In circumstances where there is no lower threshold, a first distance is defined between the sample coupling coil and the one or more inductive coupling loops. A resonant circuit is an electric circuit which has oscillating currents which are stored as energy (i.e. electric field and magnetic field) and the complex impedance of the sliding band capacitor and inductor are each near zero. The only losses in the circuit are from the pure resistive parts of the components, the inductor 1010 and the sliding band capacitor 5014. Inductive coupling is the near field wireless transmission of electrical energy between two magnetically coupled coils.

The phrases 'non-tapered skirt' or 'non-tapered inner conductance skirt' means the metal surrounding the sample and the sample coil. The movement of the sliding band capacitor 5014, relative the non-tapered skirt changes the inductance of the parent circuit.

Figures 3A, 3B:
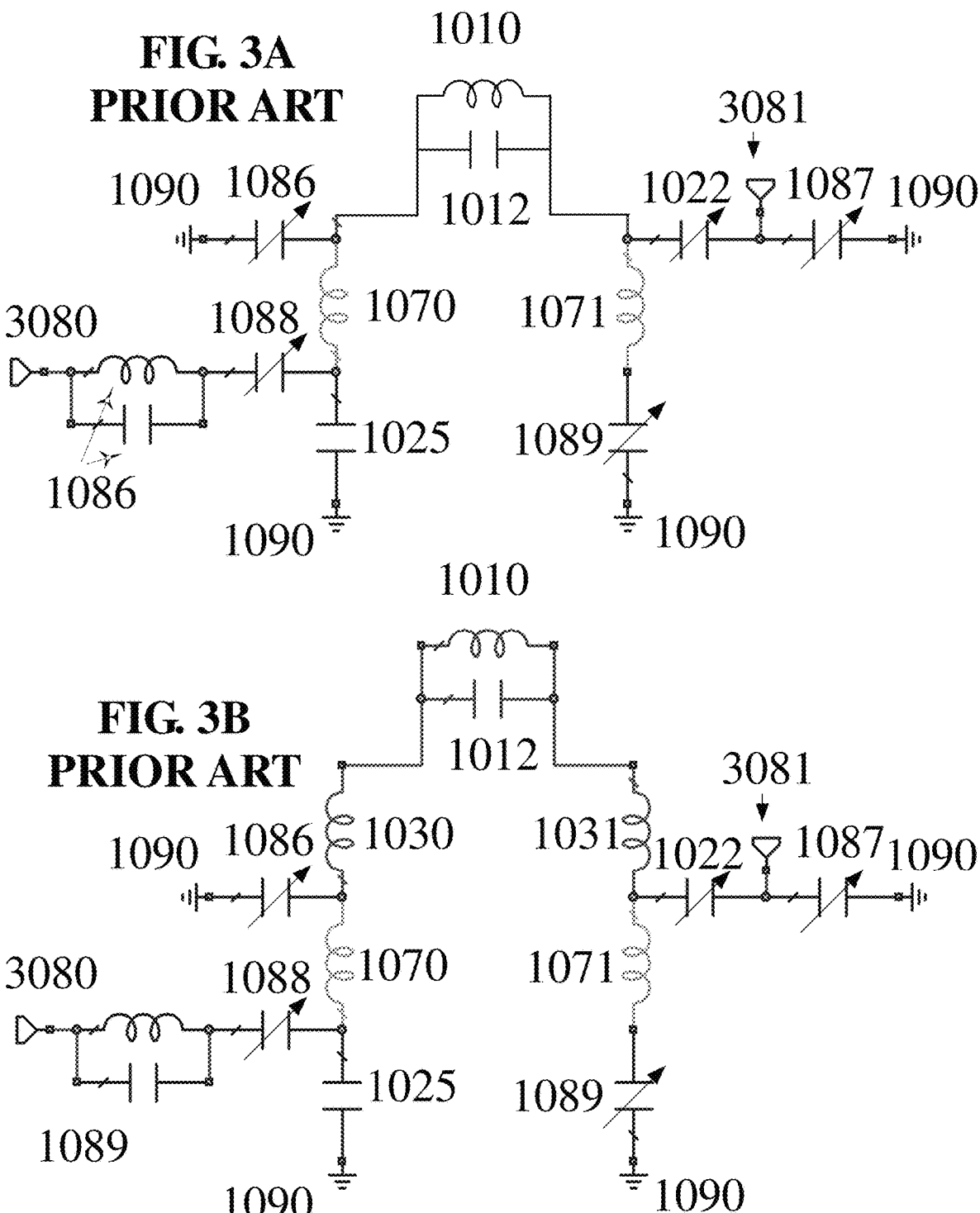
FIG. 3A is a simplified schematic of a prior art A-G parent coil.
FIG. 3B is a schematic of a prior art A-G parent coil showing the inductance of the leads 1030, 1031 used to connect the variable capacitors 1086, 1088, 1022 and 1087.

FIG. 1 shows a prior art cooled NMR probe 100 comprising two (2) polyethyl ether ketone blocks 130 that space four (4) copper palladium plated rods 140 and a quartz cylinder 150, two (2) spacer plates 250, and a variable capacitor 1022. In FIG. 1 the leads 1030, 1031 connect the variable capacitor 1022 to adjust the capacitance in the parent coil 140, 250. FIG. 3A shows a prior art circuit that can be used with the probe shown in FIG. 1. In FIG. 3A the parent coil 1010 and the capacitor 1012 are located near the sample and the lock inductor coils 1070, 1071 are used to detect the parent resonance by adjusting the variable capacitors 1086, 1088, 1022, and 1087 to match with one of the two fifty-ohm ports 3080, 3081. A resonator 1089, a fixed capacitor 1025 and the ground points 1090 are also shown. However, the leads 1030, 1031 in FIG. 1 act like inductors (see 1030 and 1031 in FIG. 3B) that dilute the SNR of the parent coil 1010. This is because the flux generated by the current in these leads 1030 and 1031 reduces the flux in the parent coil 1010. Note that the SNR for the parent coil 1010 in FIG. 3B will be maximized when the majority of the capacitance in the circuit is in the capacitor 1012 and when the capacitance in the variable capacitors 1086, 1088, 1022, and 1087 is minimized.

Figure 7:
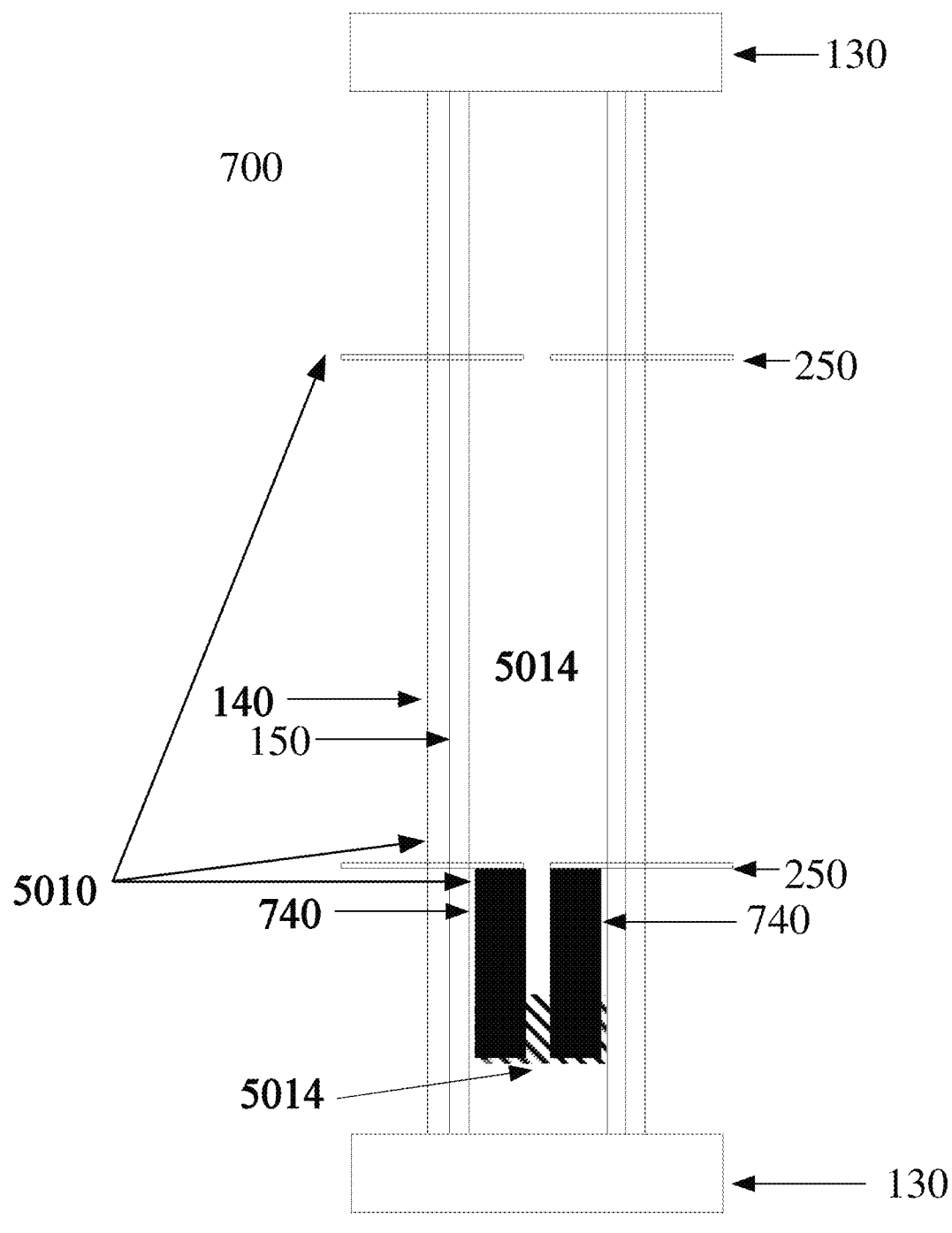
FIG. 7 is a schematic of a parent coil 5010 and sliding band capacitor 5014, together 700, according to an embodiment of the invention.

FIG. 7 shows a schematic of a parent coil 5010 and sliding band capacitor 5014, together 700. In FIG. 7, two (2) polyethyl ether ketone blocks 130 space four (4) copper rods 140 and a quartz cylinder 150. In FIG. 7, the copper rods 140, the two (2) spacer plates 250 and an non-tapered inner conductance skirt 740 comprise the parent coil 5010. In FIG. 7, a sliding band capacitor 5014.

Figure 8A:
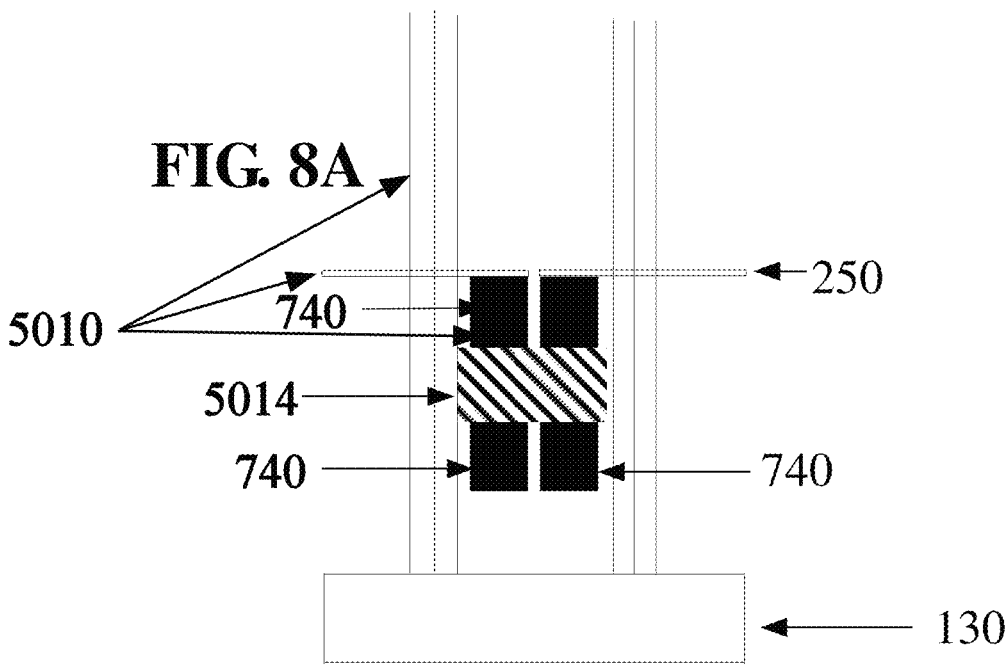
FIG. 8A is a schematic diagram of a probe, with a sliding band capacitor 5014 in which the spatial position of the sliding band capacitor 5014 relative to a non-tapered skirt 740 is raised relative to the spatial position of the sliding band capacitor 5014 relative to the position of the non-tapered skirt 740 in FIG. 8B in order to adjust the inductance of the parent coil, according to an embodiment of the invention.
Figure 8B:
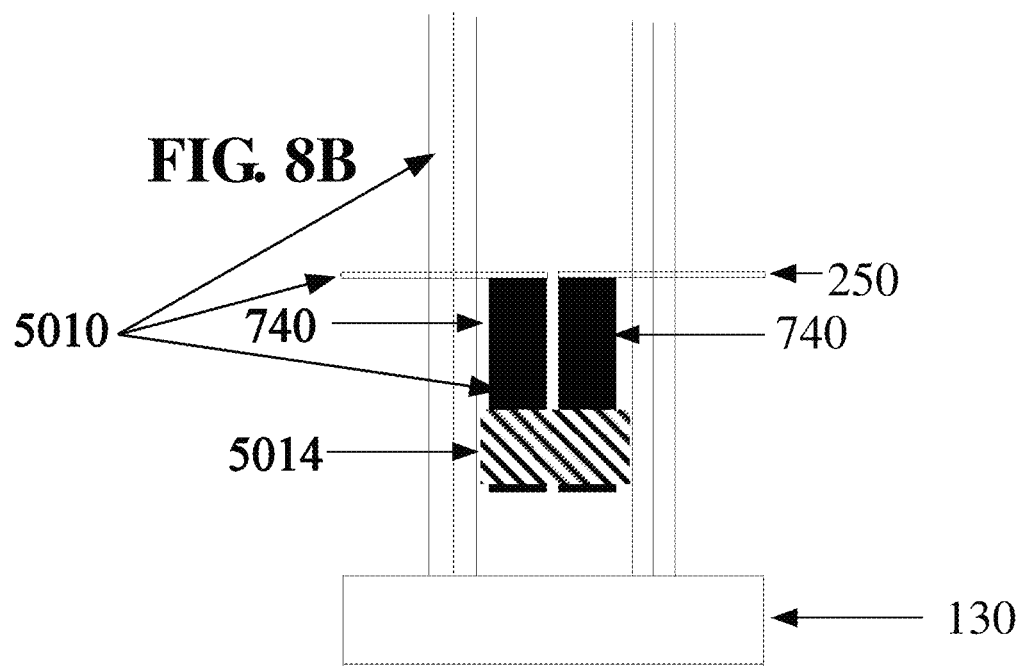
FIG. 8B is a schematic diagram of a probe, with a sliding band capacitor 5014 in which the spatial position of the sliding band capacitor 5014 relative to a non-tapered skirt 740 is lowered relative to the spatial position of the sliding band capacitor 5014 relative to the non-tapered skirt 740 in FIG. 8A in order to adjust the inductance of the parent coil, according to various embodiments of the invention.

FIG. 8 shows the movement of a sliding band capacitor 5014, relative to a non-tapered inner conductance skirt 740. In an embodiment of the present invention, with the sliding band capacitor 5014 in the lower position (see FIG. 8B) relative to the non-tapered skirt 740, the parent coil 5010 has a larger current path and accordingly a higher inductance. In an embodiment of the present invention, with the sliding band capacitor 5014 in the upper position (see FIG. 8A) relative to the non-tapered skirt 740, the parent coil 5010 has a smaller current path and accordingly a lower inductance. That is, moving the position of the sliding band capacitor 5014 relative to the non-tapered skirt 740 changes the inductance of the parent coil 5010. However, there is no significant change in the capacitance of the sliding band capacitor 5014 with movement of the sliding band capacitor 5014, since the non-tapered inner conductance skirt 740 is uniform in the vertical dimension. It is noted that the fit of the sliding band capacitor 5014 with respect to the non-tapered skirt 740 can result in some change in the capacitance of the sliding band capacitor 5014. That is, if the sliding band capacitor 5014 fits tightly within the non-tapered skirt 740 then, the capacitance of the sliding band capacitor 5014 can increase as the sliding band capacitor 5014 becomes more tightly in contact with the non-tapered skirt 740.

The phase 'sliding band capacitor' 5014 refers to a capacitance device, with at least one paramagnetic metal and at least one high conductance diamagnetic metal, where the paramagnetic metal is enclosed or surrounded by the high conductance diamagnetic metal such that the sliding band capacitor' 5014 has a very low volume magnetic susceptibility.

Figure 5:
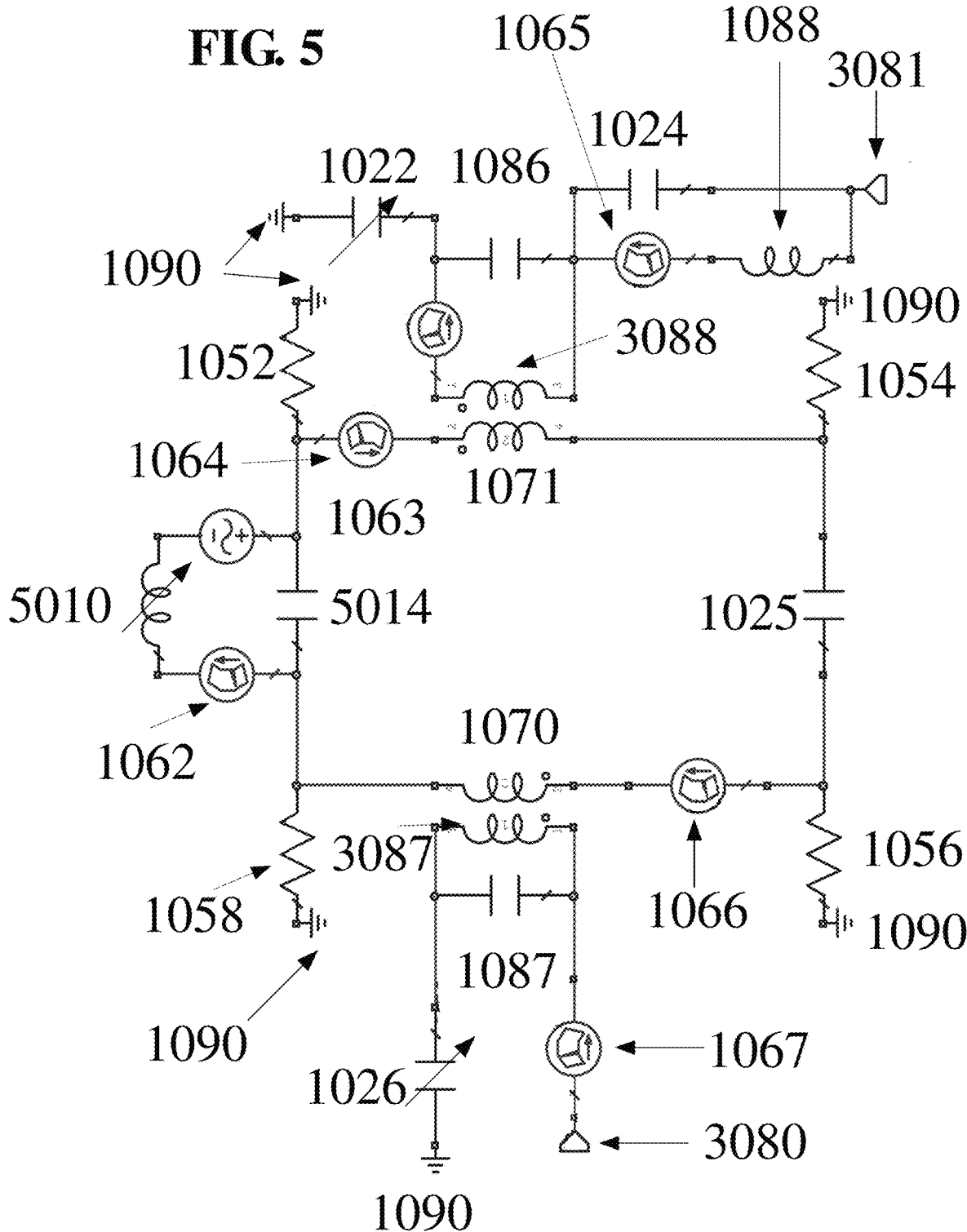
FIG. 5 is a circuit for a probe in which a sliding band capacitor 5014 comprising zero sum volume magnetic susceptibility materials is used to adjust the resonance of the parent coil 5010 being matched by the circuit, according to an embodiment of the invention.

The sliding band capacitor 5014 can be used to adjust the resonance of the parent coil 5010 and localize the energy in the parent coil 1010. FIG. 5 shows a circuit with a power supply 1063, ammeters 1062, 1064, 1066, 1067, a parent coil 5010, a sliding band capacitor 5014, resistors 1052, 1054, 1056, 1058, capacitors 1086, 1024, 1025, 1087, variable capacitors 1022, 1026, lock inductors 1070, 1071, coupling loops 3087, 3088, and grounds 1090, that can be used with the probe shown in FIG. 7. In FIG. 5, the parent coil 5010 and the sliding band capacitor 5014 are located near the sample and the lock coils 1070, 1071 are used to detect the parent resonance by inductively coupling with the variable capacitors 1022, and/or 1026 to match with one of the two fifty-ohm ports 3080, 3081. A resonator 1088, a fixed capacitor 1025 and the ground points are also shown 1090. One advantage of using a sliding band capacitor 5014 is that it eliminates the need to have leads (1030, 1031 in FIG. 1 and FIG. 3B) connecting the parent coil 1010 to lock inductors 1070, 1071 and thereby reduces the number of inductors in the circuit, thereby keeping the majority of the circulating current in the parent coil 5010. The sliding band capacitor 5014 is particularly useful when the sample inductor has a low inductance value. In this situation the leads (1030 and 1031 in FIG. 3B) going from the parent coil (1010 in FIG. 3B) to the variable capacitors (1086, 1088, 1022, and 1087 in FIG. 3B) can have an inductance on the order of the sample inductor (1010 in FIG. 3B) itself. Hence minimizing the current in leads and maximizing the circulating current in the parent coil 5010 (see FIG. 5) with the sliding band capacitor 5014 (see FIG. 5) is critical to maximizing the SNR. If the parent coil 5010 is of high inductance and the leads are of low inductance then using a sliding band capacitor 5014 can be less critical. The sliding band capacitor 5014 will help improve the SNR but not nearly as much as when the parent coil 5010 has a large inductance value. That is, it is all about the CFF, i.e. it is desirable that all the energy is in the parent coil 5010 and not in the leads or auxiliary inductors of the circuit for the mode of interest. The sliding band capacitor 5014 is closer to the parent coil 5010 than any other reactive component, such as another capacitor or another inductive component. However, because the sliding band capacitor 5014 is made of materials in which the sum of the magnetic susceptibility is approximating zero, the sliding band capacitor 5014 does not need to be compensated as the mechanical movement of the sliding band capacitor (see FIG. 8) will not disturb the magnetic field experienced (see FIG. 9) by the sample.

In the last 20 years cooling the coils has been the major focus of NMR research. For example, to provide improved sensitivity the electronics for signal detection can be cryo-cooled. However, the SNR of the RF homogeneity of the parent coil can be degraded by magnetic coupling to the coil with even small k (coupling constant) values. Further, the leads connecting a variable capacitor to the parent coil have an inductance. The inductance of these leads does not produce a flux in the $B_1$ field that penetrates the sample. Hence the filling factor is reduced because not all the inductance of the circuit produces flux which couples to the sample. Even in a situation where the parent circuit has chip capacitors across the parent coil to minimize circuit losses the leads to the variable capacitor will produce signal degradation. Accordingly, increasing the signal to noise would address (i) removing the leads and (ii) introducing a sliding band capacitor, where the sliding band capacitor does not affect the parent coil field. Further, appropriately choosing the materials in the sliding band capacitor can allow the sum of the magnetic susceptibility of the components to be minimized to zero at cryo-cooled. Finally, the materials used to construct the sliding band capacitor should allow transfer of the cryo-cooled temperatures surrounding the outside of the sliding band capacitor to the parent coil, i.e., the sliding band capacitor must be made of materials that are good heat conductors so that the cryo-cooled temperature is readily transmitted to the parent coil.

TABLE I

| | | | | | |
|---|---|---|---|---|---|
| Characteristics of some high conductance diamagnetic metals. | | | | | |
| Metal | Thermal Expansion (m/(m ° C.) | Thermal Expansion (m/(m ° K) (80° K) | Resistance (Ohm · m) 300° K | Conductance (S/m) 300° K | Volume Magnetic Susceptibility (300° K) |
| Cu | $1.76 \times 10^{-5}$ | $9 \times 10^{-6}$ | $1.68 \times 10^{8}$ | $5.8 \times 10^{7}$ | $-9.63 \times 10^{-6}$ |
| Au | $1.42 \times 10^{-5}$ | $7.9 \times 10^{-6}$ | $2.44 \times 10^{8}$ | $4.52 \times 10^{7}$ | $-3.44 \times 10^{-5}$ |

TABLE I-continued

Characteristics of some high conductance diamagnetic metals.

| Metal | Thermal Expansion (m/(m ° C.) | Thermal Expansion (m/(m ° K) (80° K) | Resistance (Ohm · m) 300° K | Conductance (S/m) 300° K | Volume Magnetic Susceptibility (300° K) |
|---|---|---|---|---|---|
| Ag | $1.98 \times 10^{-5}$ | $1.1 \times 10^{-5}$ | $1.59 \times 10^8$ | $6.3 \times 10^7$ | $-2.38 \times 10^{-5}$ |
| Sn | $2.3 \times 10^{-5}$ | $1.1\text{-}1.3 \times 10^{-5}$ | $1.1 \times 10^8$ | $8.7 \times 10^6$ | $-2.27 \times 10^{-6}$ |
| Zn | $3.42 \times 10^{-5}$ | $1.7\text{-}1.9 \times 10^{-5}$ | $5.9 \times 10^8$ | $1.82 \times 10^7$ | $1.58 \times 10^{-5}$ |

TABLE II

Characteristics of stable low volume magnetic susceptibility paramagnetic metals.

| Metal | Thermal Expansion (m/m) | Resistance (Ohm · m) 300° K | Conductance (S/m) 300° K | Volume Magnetic Susceptibility* (300° K) | Volume Magnetic Susceptibility (100° K) |
|---|---|---|---|---|---|
| Al | $2.36 \times 10^{-5}$ | $2.82 \times 10^8$ | $3.5 \times 10^7$ | $2.11 \times 10^{-5}$ | $2.5 \times 10^{-5}$ |
| Cr | $5.94 \times 10^{-6}$ | $1.3 \times 10^7$ | $7.9 \times 10^6$ | $3.18 \times 10^{-4}$ | |
| Mo | $5.4 \times 10^{-6}$ | $5.22 \times 10^8$ | $1.91 \times 10^7$ | $1.2 \times 10^{-4}$ | |
| Nb | $7.0 \times 10^{-6}$ | $1.5 \times 10^7$ | $6.7 \times 10^6$ | $2.37 \times 10^{-4}$ | |
| Pd | $1.18 \times 10^{-5}$ | $1.0 \times 10^7$ | $1.0 \times 10^7$ | $2.57 \times 10^{-4}$ | |
| Pt | $9 \times 10^{-6}$ | $1.06 \times 10^7$ | $1.0 \times 10^7$ | $7.899 \times 10^{-4}$ | |
| Rh | $7.92 \times 10^{-6}$ | $4.49 \times 10^8$ | $2.23 \times 10^7$ | $1.69 \times 10^{-4}$ | |
| Ta | $6.5 \times 10^{-6}$ | $1.3 \times 10^7$ | $7.7 \times 10^6$ | $1.78 \times 10^{-4}$ | |
| Ti | $8.64 \times 10^{-6}$ | $4.2 \times 10^7$ | $2.3 \times 10^6$ | $1.78 \times 10^{-4}$ | $1.81 \times 10^{-4}$ |
| Ti—Al—V" | | | | $1.8 \times 10^{-4}$ | $-8.27 \times 10^{-6}$ |
| W | $4.5 \times 10^{-6}$ | $5 \times 10^8$ | $5.6 \times 10^8$ | $8.84 \times 10^{-5}$ | |
| V | $7.92 \times 10^{-6}$ | $2 \times 10^7$ | $8 \times 10^5$ | $3.84 \times 10^{-4}$ | |
| Y | $7\text{-}13 \times 10^{-6}$ | $5.7 \times 10^7$ | $1.8 \times 10^6$ | $2.98 \times 10^{-4}$ | |

*In Tables I and II Volume Magnetic Susceptibility is in S.I. Units and is a dimensionless quantity. Absent express recitation to the contrary, Volume Magnetic Susceptibility is in S.I. Units and as such is a dimensionless quantity;
"= 90% Ti, 6% Al, 4% V, see Data Handbook, Appendix A6, Properties of Solids at Low Temperatures, p579. Based on the reported diamagnetism of Ti—Al—V" in Table II, a suitable Titanium alloy would comprise greater than 92% titanium.

Titanium is highly reactive to trace amounts of water and metal oxides. The Hunter process generates titanium from the titanium tetrachloride salt by reduction with liquid sodium metal. Alternatively, liquid calcium can be used as the reductant. Titanium tetraiodide can also be decomposed to generate titanium metal. The Kroll process reduces titanium tetrachloride using liquid magnesium in a stainless-steel vessel at above 800° C. to generate a porous metallic titanium sponge. The sponge can be further purified by leaching, vacuum distillation. The Kroll process replaced the Hunter process for almost all commercial production. Alternatively, titanium oxide in a solution of molten calcium chloride can be electrolytically reduced to give titanium metal. Using an electron beam furnace and vacuum are remelting furnace, a high purity titanium can be obtained. The precise method used to generate the titanium metal will affect the purity and composition of the resulting titanium foil, see Tables III and IV.

TABLE III

Characteristics of some Titanium foils (ppm).

| * | Fe | Ni | Cr | Al | V | Mn | S | Zn | Zr | Si | Sn | Cu | O |
|---|---|---|---|---|---|---|---|---|---|---|---|---|---|
| 1 | <15 | <5 | <5 | <5 | NS | NS | NS | NS | NS | <3 | <3 | <3 | <300 |
| 2 | 5 | 2 | <1 | <1 | NS | NS | NS | NS | NS | <0.5 | <0.5 | <0.5 | <200 |
| 3 | <10 | <3 | <6 | <3 | <3 | <1 | <1 | <1 | <3 | NS | NS | <10 | NS |

* Manufacturer: 1 = Toho >99.995 4N5 spec, 2 = Toho typical, 3 = Goodfellow 0.002 mm 99.995 T100-000106 rolled, NS not specified.

TABLE IV

| | | | Characteristics of some Titanium foils. | | | | |
|---|---|---|---|---|---|---|---|
| ** | Ti | Fe | C | N | H | Other | O |
| 4 | >99.175 | ≤0.20% | ≤0.10% | ≤0.030% | ≤0.015% | ≤0.30% | ≤0.18% |
| 5 | 99.0 | <0.2% | <0.08% | <0.03% | <0.015% | <0.40% | <0.18% |
| 6 | NS | ≤0.020% | ≤0.08% | ≤0.03% | ≤0.015% | NS | ≤0.018% |

** Manufacturer: 4 = RTP, 5 = Ulbrich grade 1, UNS R50250, 6 = SD-Metals ASTM B265 | ASME SB265 | ASTM F67 | ISO 5832-2 | 3.7025 | UNS R50250, NS not specified.

In an embodiment of the present invention, the low temperature probe is surrounded by a 12.28 (ID) sapphire ring which is surrounded by at least two 0.03 mm titanium foils which are then enclosed or surrounded by a 0.025 mm copper foil, where the diamagnetism due to the 12.28 (ID) sapphire ring and the diamagnetism due to the 0.025 mm copper foil offsets the paramagnetism of the at least two 0.03 mm titanium foils. In an alternative embodiment of the present invention, the low temperature probe is surrounded by a sapphire ring which is surrounded by an aluminum foil which is then encased by a silver foil, where the diamagnetism due to the sapphire ring and the diamagnetism due to the silver foil offsets the paramagnetism of the aluminum foil.

In an embodiment of the present invention, the low temperature probe is surrounded by a 12.28 (ID) sapphire ring which is in turn surrounded by at least two metal layers, where the sum of the magnetic susceptibility of the sapphire ring and the at least two metal layers is less than $1\times10^{-4}$ at 300° K and less than $1\times10^{-5}$ at 80° K, where a first metal of the at least two metal layers is a diamagnetic metal, where a second metal of the at least two metal layers is a paramagnetic metal, where the first metal is located on the surface facing away from the low temperature probe and has a conductivity of greater than $4\times10^{-7}$ S/m. In an embodiment of the invention, the at least two metal layers comprise copper and titanium, where a thin copper foil encloses or surrounds two or more thin titanium foils, where the diamagnetism due to the sapphire ring and the layers of thin copper foil is offset the paramagnetism of the two or more thin titanium foil(s). In an alternative embodiment of the present invention, the low temperature probe is surrounded by a 12.28 (ID) sapphire ring which is surrounded by a 0.025 mm copper foil which in turn is surrounded by two or more 0.03 mm titanium foils, which are then surrounded on all sides by the 0.025 mm copper foil, where the diamagnetism due to the 12.28 (ID) sapphire ring and the 0.025 mm copper foil offsets the paramagnetism of the two or more 0.03 mm titanium foils.

In an embodiment of the present invention, a 13.05 mm (OD) 12.28 mm (ID)×10 mm L sapphire ring (AdValue Tech, AZ, USA) can enclose the low temperature probe. In an embodiment of the present invention, a 0.025 mm copper foil (Basic Copper, NC, USA) can surround an annealed 0.03 mm titanium foil (Goodfellow, UK). In an embodiment of the present invention, the Ti foil is grade 1 (ASTM B265 Chemistry only) and has a titanium content greater than approximately 98%. In this circumstance, approximately means that the efficiency is plus or minus two (2) percent. In an embodiment of the present invention, the Cu foil is >99.9% Cu, with an electrical conductivity of 101% International Annealed Copper Standard (IACS), where 100% IACS is equivalent to a conductivity of $5.8\times10^7$ Siemens per meter (S/m) at 20° C. In an embodiment of the present invention, after the titanium foil is surrounded by the copper foil, the exposed edge of the copper foil edge can be soldered using 42Sn58Bi solder wire (Indium Corporation, NY, USA) and Superior 30 flux (Superior Flux & Mfg. Co., Ohio, USA).

In an embodiment of the present invention, the sliding band capacitor materials can have a high thermal conductivity. The thermal conductivity of fused quartz is 1.4 W/(m·C) at 20° C., but is significantly reduced at 80° K [8.4 W/(m·K)]. The thermal conductivity of sapphire is 23 W/(m·C) at 23° C. and remains good at 80° K. The thermal conductivity of titanium is 1.8 W/(cm·K) at 25° C. and remains excellent at 80° K [11.4 W/k·K at 240° C.]. The thermal conductivity of aluminum is 237 W/(m·K) at 25° C., and remains good at 80° K.

In an embodiment of the present invention, the outer surface of the sliding band capacitor material can have a high conductivity. If the sliding band capacitor had a low conductivity, then it would result in a low Q.

The word 'near' refers to the position of the sample relative to the parent coil. The SFF is maximized by having the parent coil as close to the sample as physically possible.

The issue in prior art low temperature probes (see FIG. 3A and FIG. 3B) is that the leads 1030, 1031 from the parent coil 5010 to the variable tune capacitors 1086, 1022 and 1087 can constitute a significant portion of the inductance observed. These losses result in sample filling factor losses (SFF) because the $B_1$ flux from the leads does not go thru the sample (see Equation 3).

The phrase 'Circuit Fill Factor (CFF)' means for a specific mode, k, the definition of $CFF_{k,a}$ referred to a reference inductor, a is given by Equation 3.

$$CFF_{k,a} = \frac{L_a i_a^2}{\sum_{j=1}^{N} L_j i_j^2},$$

Equation 3 where a is the sample inductor, i is the current in the inductor, the j indices identify specific inductors, and it is implicit that the current values are for the kth mode. The $CFF_{k,a}$ is a measure of the efficiency of a probe circuit. The $CFF_{k,a}$ determines for the $k^{th}$ mode of a circuit how much energy is delivered to a specific inductor, a. Here the $CFF_{k,a}$ is a measure of the efficiency of the parent coil in the probe circuit. It is clear that this definition does not accommodate the presence of mutual inductance. It can be concluded from Equation 2 and Equation 3, that the presence of more than one inductor in the circuit dilutes the signal to noise ratio of the multiply tuned probe circuit. For probe circuits with multiple ground points there exist the question of what is the common ground point. If the ground points are not at the same potential as the common ground point then each ground point is essentially an inductor to that common ground point and such a circuit generates the potential to dilute the $CFF_{k,a}$ of the circuit. Hence, eliminating the variable tune capacitors (e.g., 1086, 1022 and 1087 in FIG.

3B) and thereby the leads (e.g., 1030, 1031 in FIG. 3B) is highly desirable. Eliminating ground points 1090 that are not at the same potential is also highly desirable.

The phrase 'electrically connected' means a connection where electrons will flow (i.e., in a circuit with a capacitor, electrons do not flow across the capacitor).

The phrase 'the field strength of the magnetic field in the location remains essentially constant' means that the incremental change in the magnetic field is less than approximately 1 ppm. In this circumstance, approximate means plus or minus 0.1 ppm.

Figure 9:
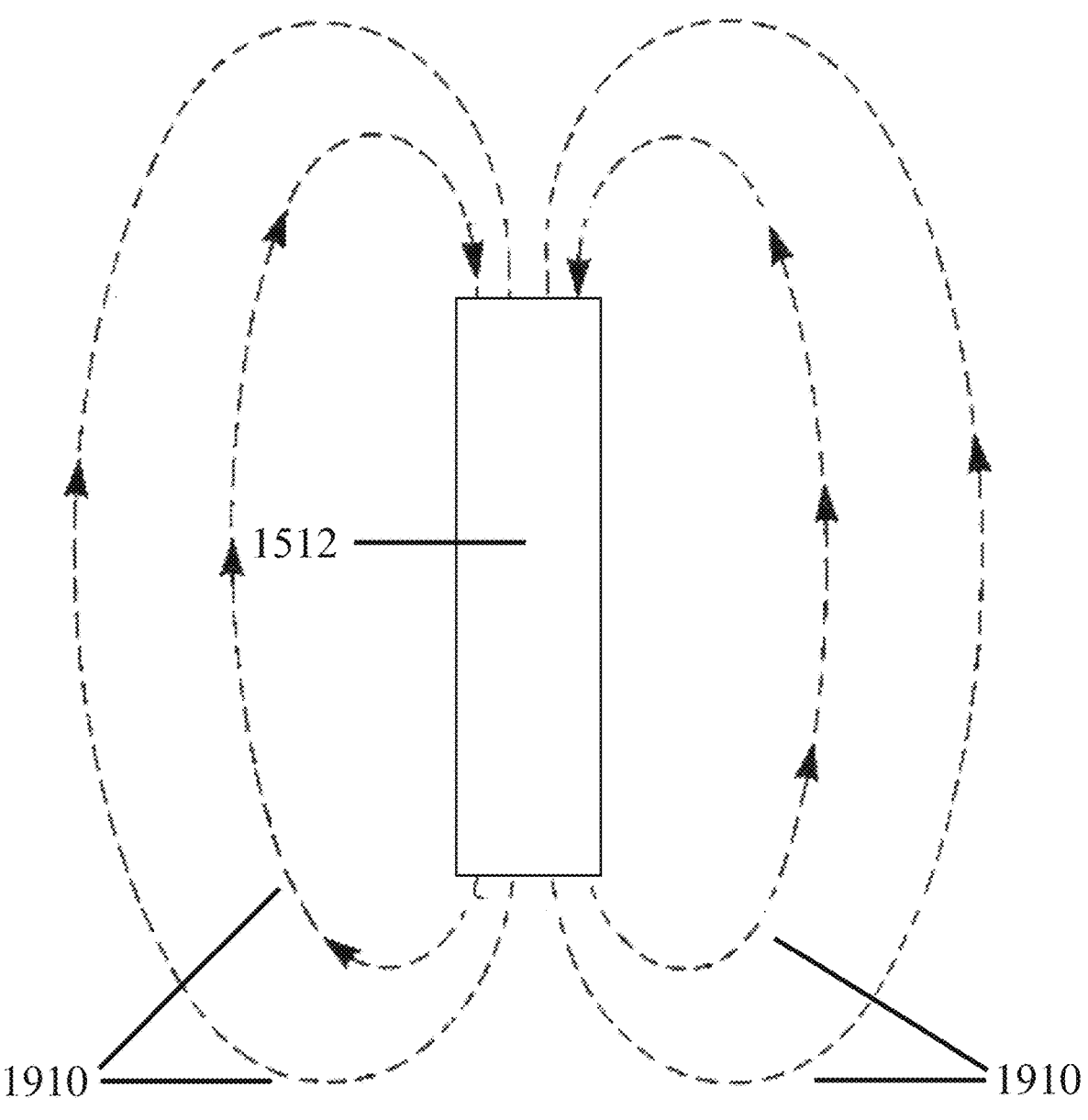
FIG. 9 is a schematic diagram showing the sliding band capacitor 5014 field lines surrounding the parent coil (not shown), according to various embodiments of the invention.

The phrase 'the RF field symmetry is minimally affected by the position of the sliding band capacitor' means that a 2D plot of the sliding band capacitor 5014 field lines 1910 show the right-side field lines being the approximate mirror images of the left-hand side field lines, as shown in FIG. 9. In this circumstance, approximate means that the left side and the right side are mirror images superimposable within a ten (10) percent tolerance.

An NMR probe can include a sample, a parent detection coil/associated circuitry, a lock coil/associated circuitry, a pulsed field gradient, one or more coupling coils/associated circuitry, one or more fixed capacitors, one or more variable capacitors, a stator to support the sample, and the parent detection coil and a sliding band capacitor. The sliding band capacitor comprises a diamagnetic support, a paramagnetic material that is surrounded with a high conductance diamagnetic material. A perturbation of the magnetic field or the flux generated by the parent coil will reduce the signal to noise ratio. Accordingly, minimizing the components in the sample region of the NMR probe can reduce perturbations of the magnetic field ($B_0$), the RF homogeneity and accordingly increase the signal to noise ratio.

As known in the art, the term S11 refers to the forward reflection of a first input port, which is a measure of the impedance match. The term S22 refers to the forward reflection of a second input port, which is a measure of the impedance match.

In an embodiment of the present invention, the cryo-cooled temperature limitation problem can be solved by selecting an appropriate inductance parent coil and tuning the parent coil by adjusting a sliding band capacitor, in which the sliding band capacitor does not distort the magnetic field of the parent coil, i.e., the parent coil is surrounded by materials in which the sum of the magnetic susceptibility is zero at cryo-cooled temperatures. The RF-homogeneity of the parent coil is a concern when there are leads is close in proximity to the parent coil. Ensuring the RF-homogeneity of the parent coil is a major advantage of using the sliding band capacitor, as per embodiments of the invention.

The word 'adjusted' when used in the phrase 'interaction between the parent coil 5010 and the lock coils 1070, 1071 is adjusted to a resonant condition' means the CFF for the circuit would show greater than approximately ninety (90) percent of the energy resides in the parent coil 5010. Approximately in this range means plus or minus ten (10) percent.

Absent express recitation to the contrary, the term 'approximately' means a nominal value plus or minus ten (10) percent thereof.

In the NMR experiment, the relationship between SNR, Quality factor for a resonator k ($Q_k$), Sample Fill Factor (SFF) and Circuit Fill Factor ($CFF_{k,a}$) is given by Equation 2, where is a dimensionless parameter defined as the ratio of the initial energy stored in the resonator to the energy lost in one radian of the cycle of oscillation.

According to Equation 2, in order to maximize the SNR, it is necessary to maximize $Q_k$, SFF and/or $CFF_{k,a}$. To maximize $Q_k$ is maximized by increasing the surface area of the conductor forming the resonator, thus a large surface area for the conductor in the parent coil is preferred. This usually is resolved by using a low inductance coil, i.e. similar to an Alderman-Grant coil. A measure of the SFF is the square of the ratio of the sample diameter divided by the diameter of the parent coil. Coils with larger surface areas generally result in higher SFF values. In addition, the SFF can be maximized by having the parent coil as close to the sample as physically possible. Further, $CFF_{k,a}$ can be maximized by having the fewest inductors in the circuit as possible. That is, by connecting a variable capacitor to the parent coil, the circuit shown in FIG. 3A is actually more accurately represented by the circuit shown in FIG. 3B. That is, the number of inductors in the circuit shown in FIG. 3B has been increased by two (2), being the number of leads 1030, 1031 connecting to the variable capacitors 1086, 1088, 1022 and 1087. In an embodiment of the present invention, the parent coil can be tuned using a sliding band capacitor i.e., a capacitor that is built into the resonator circuit without leads to connect the means of varying the capacitance to the parent coil. By tuning a parent coil with such a sliding band capacitor with no leads to attach the sliding band capacitor to the circuit measuring the parent coil inductance, then the number of inductors in the circuit can be decreased (by two (2)) and accordingly the CFF of the parent coil can be increased (see Equation 1).

$$M_{a,b} = K * (L_a * L_b)^{1/2}. \qquad \text{Equation 1}$$

Importantly, in the circuit shown in FIG. 5 the inductive coupling loops exhibit very little loss.

The circuit shown in FIG. 5 has several advantages, a) the coupling loops don't interfere with the coils in the sample region of the probe, b) RF distortion of the parent coil $B_1$ field from the lock coils 1070, 1071 is eliminated by using a sliding band capacitor 5014 to couple to the resonance of the parent coil 5010, c) the sliding band capacitor 5014 doesn't have to be susceptibility corrected due to its proximity to the parent coil 5010 since the sum of the volume magnetic susceptibility is near zero, d) RF distortion of the parent coil $B_1$ field from the sliding band capacitor 5014 is eliminated through choice of materials for the diamagnetic support of the sliding band capacitor 5014 and e) the lock coils don't have to be susceptibility corrected due to their proximity to the parent coil since they are not located in the region of the probe.

$$SNR \propto \sqrt{(SFF * CFF_{k,a} * Q_k)}. \qquad \text{Equation 2}$$

To analyze the circuits shown in this paper a CFF analysis was conducted. As shown in Equation 2, the SNR depends on the $CFF_{k,a}$. $CFF_{k,a}$ for the sample inductor (a) for the observed mode (k) and $Q_k$ is the Q of the $k^{th}$ mode.

In the following description, various aspects of the present invention are described. However, it will be apparent to those skilled in the art that the present invention can be practiced with only some or all aspects of the present invention. For purposes of explanation, specific numbers, materials, and configurations are set forth to provide a thorough understanding of the present invention. However, it will be apparent to one skilled in the art that the present invention can be practiced without the specific details. In other instances, well-known features are omitted or simplified in order not to obscure the present invention.

Parts of the description are presented in data processing terms, such as data, selection, retrieval, generation, and so forth, consistent with the manner commonly employed by those skilled in the art to convey the substance of their work to others skilled in the art. As is well understood by those skilled in the art, these quantities (data, selection, retrieval, generation) can take the form of electrical, magnetic, or optical signals capable of being stored, transferred, combined, and otherwise manipulated through electrical, optical, and/or biological components of a processor and its subsystems.

Various operations are described as multiple discrete steps in turn, in a manner that is helpful in understanding the present invention; however, the order of description should not be construed as to imply that these operations are necessarily order dependent.

Various embodiments are illustrated in terms of exemplary classes and/or objects in an object-oriented programming paradigm. It will be apparent to one skilled in the art that the present invention can be practiced using any number of different classes/objects, not merely those included here for illustrative purposes.

Aspects of the invention are illustrated by way of example and not by way of limitation in the figures of the accompanying drawings in which like references indicate similar elements. It should be noted that references to 'an' or 'one' embodiment in this disclosure are not necessarily to the same embodiment, and such references mean at least one.

There remain encumbrances to the employment of inductively coupled low temperature probes to the NMR technique for a variety of samples and various experimental conditions. In general, low temperature dual probe circuits do not utilize inductive coupling to achieve the double-tuned circuit but rather use capacitive coupling to achieve the desired tuning properties. Here we show the use of inductive coupling to achieve the desired tuning properties in low temperature NMR probes.

Figures 2A, 2B, 2C:
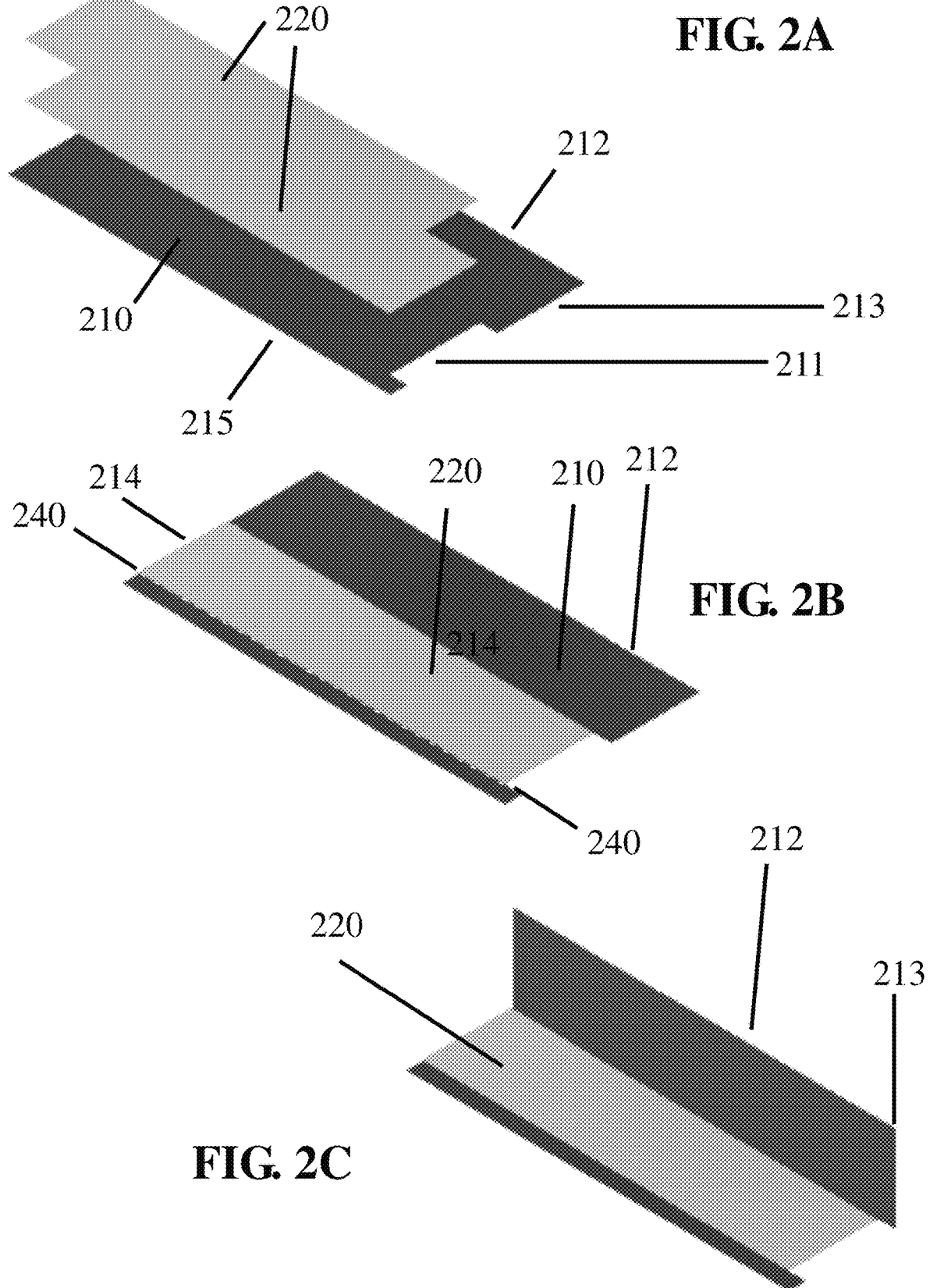
FIG. 2A is a schematic diagram showing two thin foils of titanium 220 arranged above a copper foil 210 which has been cut into a desired shape with edges 211, 212, 213, 214, and 215, according to an embodiment of the invention.
FIG. 2B is a schematic diagram showing the foils of titanium 220 positioned on top of the copper foil 210 such that the edge of the titanium foils is aligned with construct 240, according to an embodiment of the invention.
FIG. 2C is a schematic diagram showing the foils of titanium 220 positioned on top of the copper foil 210 with a first fold at a position which will allow edge 212 to meet construct 240, according to an embodiment of the invention.
Figures 2D, 2E, 2F:
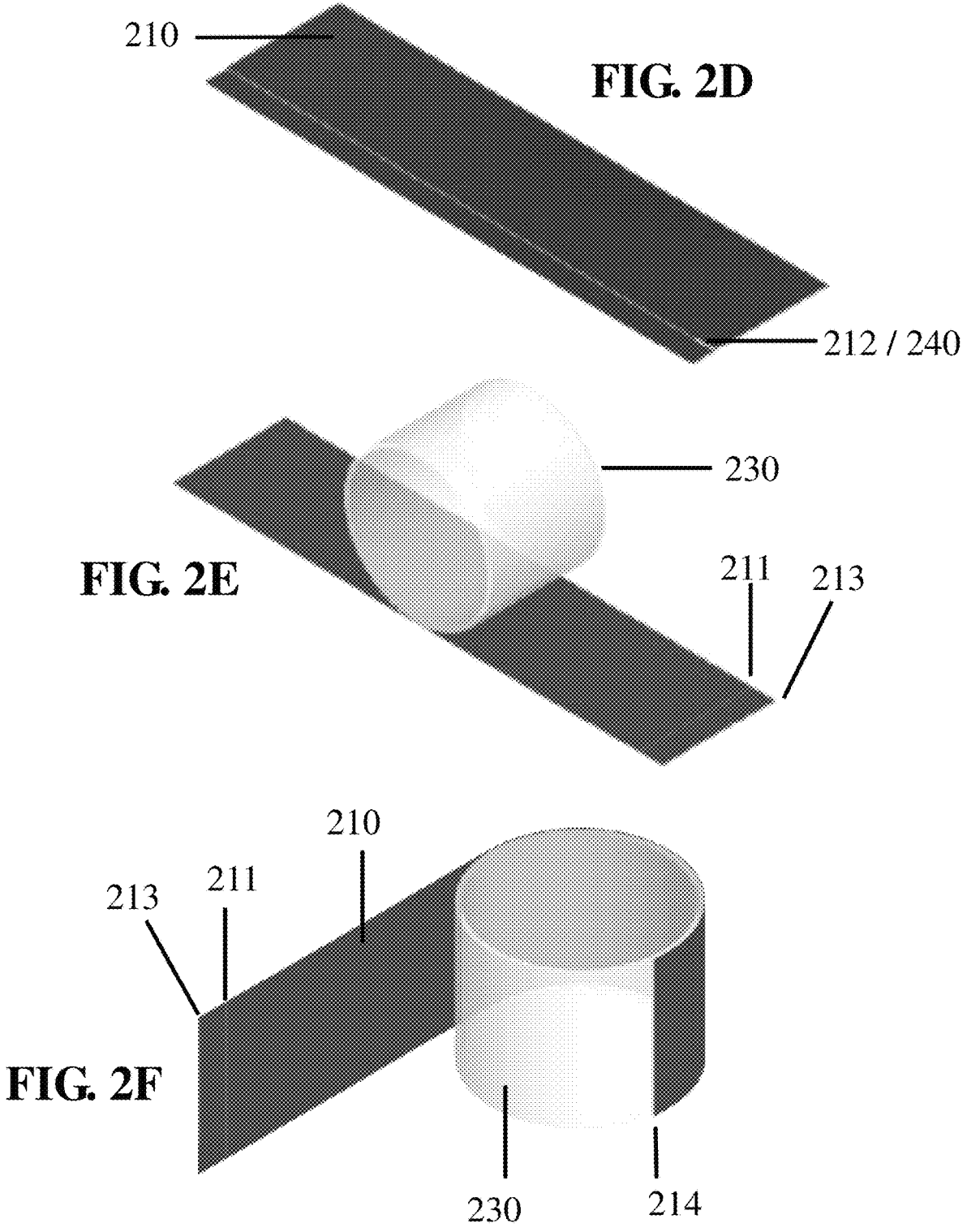
FIG. 2D is a schematic diagram showing the copper foil 210 with a second fold where edge 212 is aligned with construct 240, according to an embodiment of the invention.
FIG. 2E is a schematic diagram showing the sapphire ring 230 placed on the copper foil 210, according to an embodiment of the invention.
FIG. 2F is a schematic diagram showing the copper foil 210 being wrapped around the sapphire ring 230, according to an embodiment of the invention.
Figures 2G, 2H, 2I:
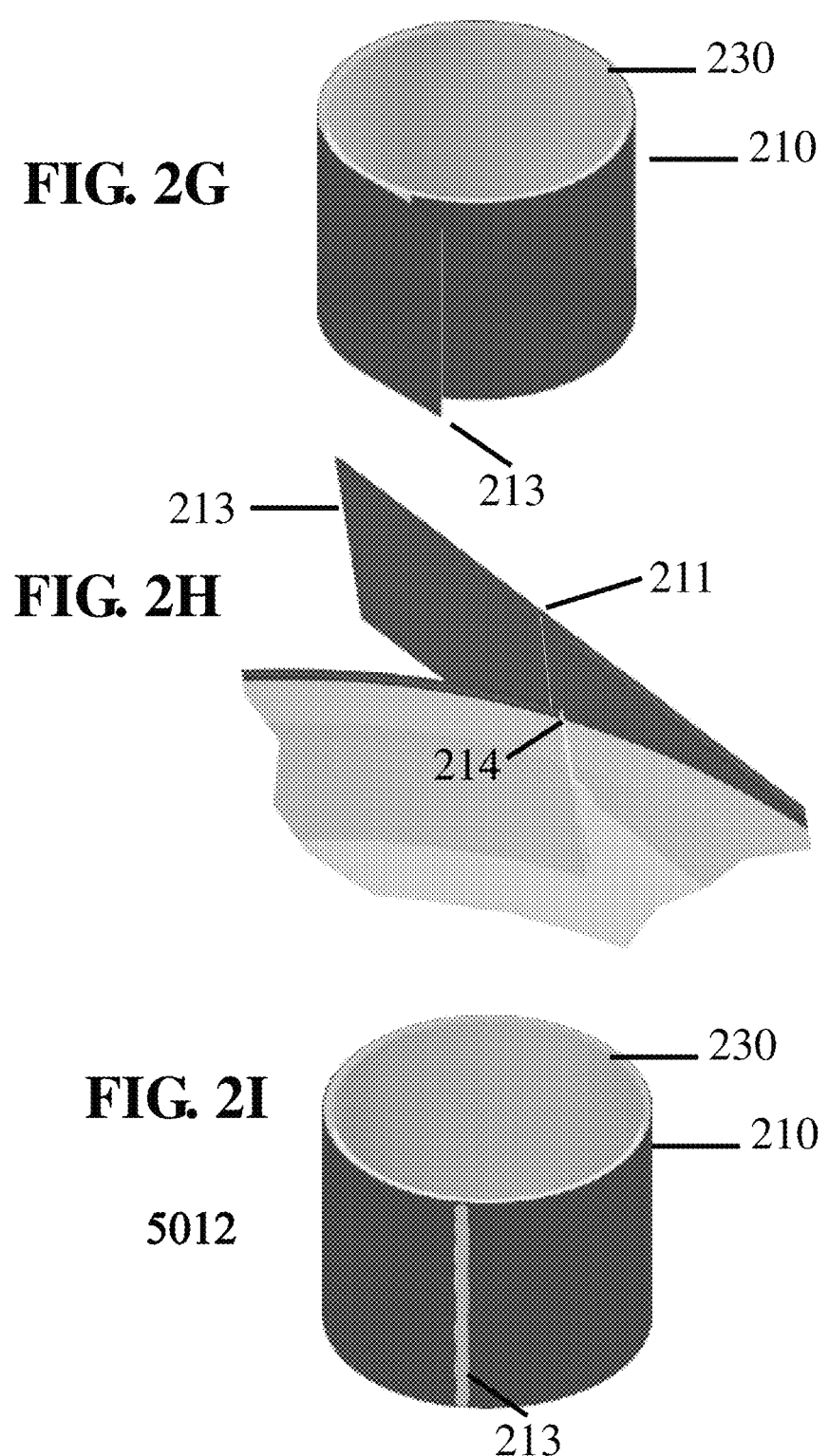
FIG. 2G is a schematic diagram showing the copper foil 210 wrapped around the sapphire ring 230 where edge 213 overlaps the edge 214, according to an embodiment of the invention.
FIG. 2H is a schematic diagram showing an expanded view of the copper foil 210 where edge 211 aligns with edge 214 and where edge 213 overlaps the edge 211/214, according to an embodiment of the invention.
FIG. 2I is a schematic diagram showing the copper foil 210 surrounding the titanium foils and the edge 213 which can be soldered, according to an embodiment of the invention.

In an embodiment of the present invention, two pieces of grade 1, 30 μm titanium foil 220 can be used as a diamagnetic metal to compensate for a piece of 25.4 μm copper foil 210. The two pieces of titanium foil 220 are positioned above each other on the copper foil 210 such that they are aligned with position 240, as shown in FIG. 2A. In an alternative embodiment of the present invention, one piece of grade 1, 60 μm titanium foil 220 can be used as a diamagnetic metal to compensate for a piece of 25.4 μm copper foil 210. The single titanium foil 220 can be positioned on the copper foil 210 such that they it is aligned with position 240, as shown in FIG. 2A. The copper foil 210 can be cut into a shape with edges 211, 212, 213, and 214, as shown in FIG. 2A and FIG. 2B. The copper foil 210 can be folded such that edge 212 aligns with position 240, as shown in FIG. 2C and FIG. 2D. The reverse side of the copper foil 210 can encircle a 13.05 mm OD×12.28 mm ID×10 mm L sapphire ring 230 (AdValueTech), as shown in FIG. 2E, FIG. 2F, and FIG. 2G. In FIG. 2F, the edge 211 contacts the edge of the two titanium foils 210, where the edge 213 extends the copper foil at single thickness (i.e., without covering the two titanium foils 210). The length of edge 212 is measured and cut to allow edge 214 to align with edge 211, as shown in FIG. $^{2}$H. The edge 213 can be sealed with a small amount of 42Sn58Bi solder using Superior 30 flux, as shown in FIG. 2I.

Inductive Tuning of AG Coil

$^{19}$F Resonance Example 1

In an embodiment of the present invention, with the sliding band capacitor 5014 in the lower position (see FIG. 8B) relative to the non-tapered skirt 740 the parent coil 5010 has a larger current path and accordingly a higher inductance. Assigning a capacitance for the sliding band capacitor of 5 pF with a 10 mm ID and 10.23 OD parent coil for a 500 MHz NMR system, the inductance of the parent coil 5010 is determined to be 21.7 nH which would allow the parent coil 5010 to resonate at 483.31 MHz and detect the $^{19}$F resonance. The tuning range at this sliding band capacitor 5014 position would be 48.17 MHz (copper foil thickness 25.4 μm, sapphire thickness 0.4 mm ID 10.36 mm, OD 11.16 mm, and titanium foil is 41.32 mm×10 mm×60 μm).

$^{1}$H Resonance Example 2

In an embodiment of the present invention, with the sliding band capacitor 5014 in the upper position (see FIG. 8A) relative to the non-tapered skirt 740 the parent coil 5010 has a smaller current path and accordingly a lower inductance. Assigning a capacitance for the sliding band capacitor of 5 pF with a 10 mm ID and 10.23 OD parent coil for a 500 MHz NMR system, the inductance of the parent coil 5010 is determined to be 17.9 nH which would allow the parent coil 5010 to resonate at 531.48 MHz and detect the $^{1}$H resonance. The tuning range at this sliding band capacitor 5014 position would be 48.17 MHz (copper foil thickness 25.4 μm, sapphire thickness 0.4 mm ID 10.36 mm, OD 11.16 mm, and titanium foil is 41.32 mm×10 mm×60 μm).

$^{13}$C Resonance Example 3

In an embodiment of the present invention, the sliding band capacitor 5014 together with a chip capacitor can be used to adjust a 500 MHz NMR system to resonate around 125 MHz. Assigning a capacitance for the sliding band capacitor and the chip capacitors of 67 pF with a 12 mm parent coil OD (or larger) the inductance of the parent coil 5010 is determined to be 18 nH which would allow the parent coil 5010 to resonate at 144.93 MHz (or 20 nH for 137.49 MHz, 22 nH for 131.09 MHz or 24 nH 125.51 MHz) to detect the $^{13}$C resonance. The tuning range at this sliding band capacitor 5014 position would be approximately 9 MHz. Approximately in this range means plus or minus ten (10) percent (copper foil thickness 25.4 μm, sapphire thickness 0.4 mm ID 10.36 mm, OD 11.16 mm, and titanium foil is 41.32 mm×10 mm×60 μm).

Figure 4A:
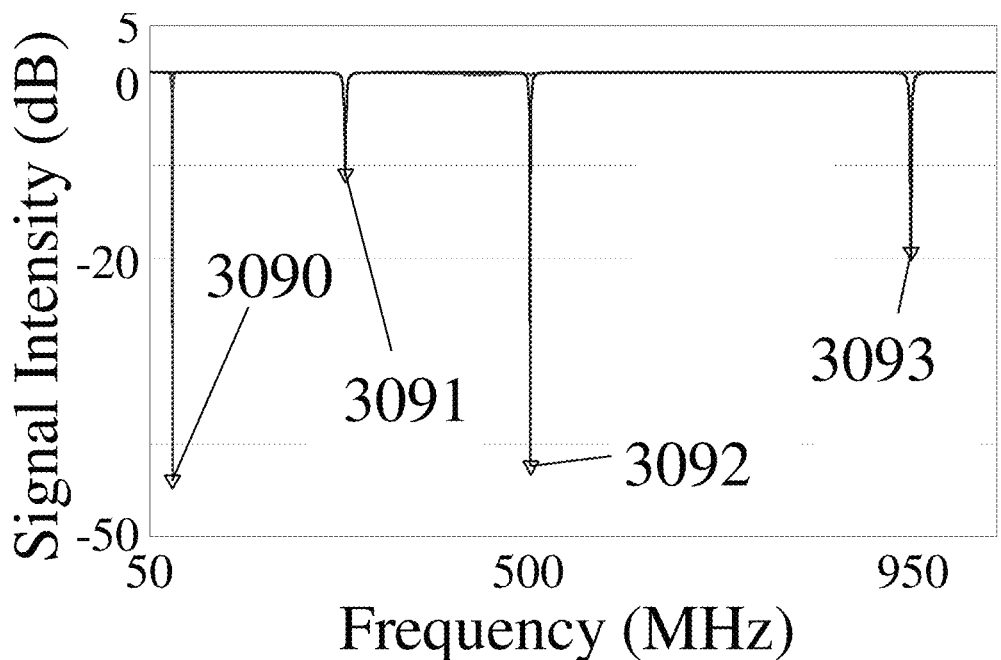
FIG. 4A is a two-port plot overlay simulation showing the signal intensity DB(S11/S22) versus the frequency for $^1$H 3092 and $^2$H 3090 based on the circuit shown in FIG. 3B.
Figure 4B:
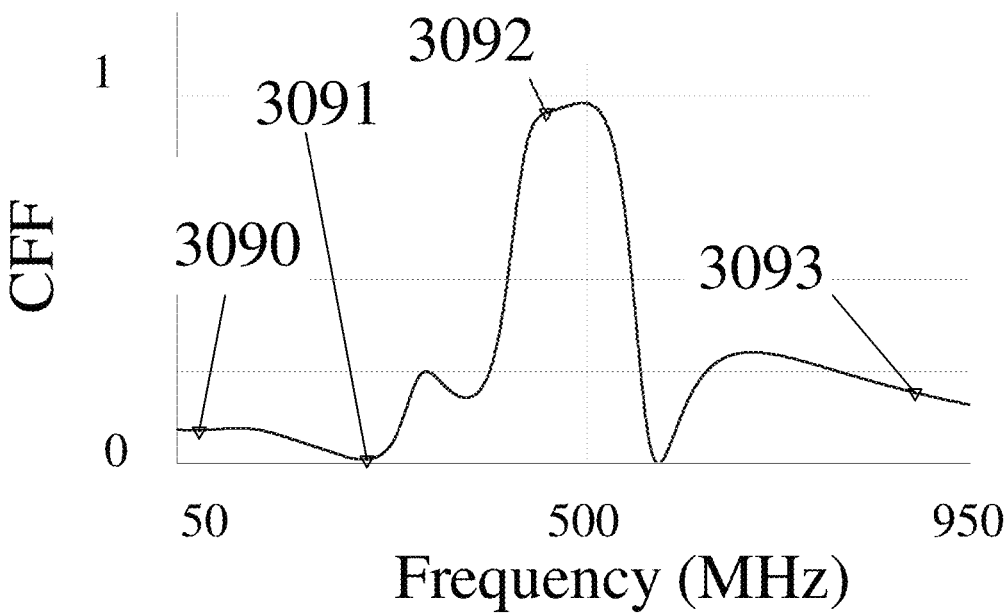
FIG. 4B is a CFF plot versus the frequency for $^1$H 3092 and $^2$H 3090 based on the circuit shown in FIG. 3B for the frequency as adjusted in FIG. 4A (where the leads 1030, 1031 result in resonances 3091, 3093)

For the calculations based on the circuit shown in FIG. 3B, the parent coil 5010 has an inductance of 15 nH, the leads e.g. 1030, 1031 in FIG. 1 are assigned inductances of 13 nH, the lock inductors 1070, 1071 are assigned inductances of 90 nH and 1090 signifies ground. FIG. 4A is a two-port plot overlay simulation showing the signal intensity DB(S11/S22) versus the frequency for 3090 $^{2}$H (76.8 MHz, −43.8 dB), 3091 (281 MHz, −10.8 dB), 3092 $^{1}$H (500 MHz, −42.3 dB) and 3093 (949 MHz, −19.2 dB) signals, based on the circuit shown in FIG. 3B adjusted to detect $^{1}$H. The inductors 1030, 1031 result in resonances observed at 3091 (281 MHz, −10.8 dB) and 3093 (949 MHz, −19.2 dB). FIG. 4B is a CFF plot versus the frequency for the circuit shown in FIG. 3B adjusted to detect $^{1}$H (i.e., adjusted as shown in FIG. 4A) showing 3090 $^2$H (76.8 MHz, CFF=0.0721), 3091 (281 MHz, CFF=0.0092), 3092 $^1$H (500 MHz, CFF=0.7635) and 3093 (949 MHz, CFF=0.1546), where the inductance in leads 1030, 1031 in FIG. 3 results in resonances 3091, 3093.

Figure 4C:
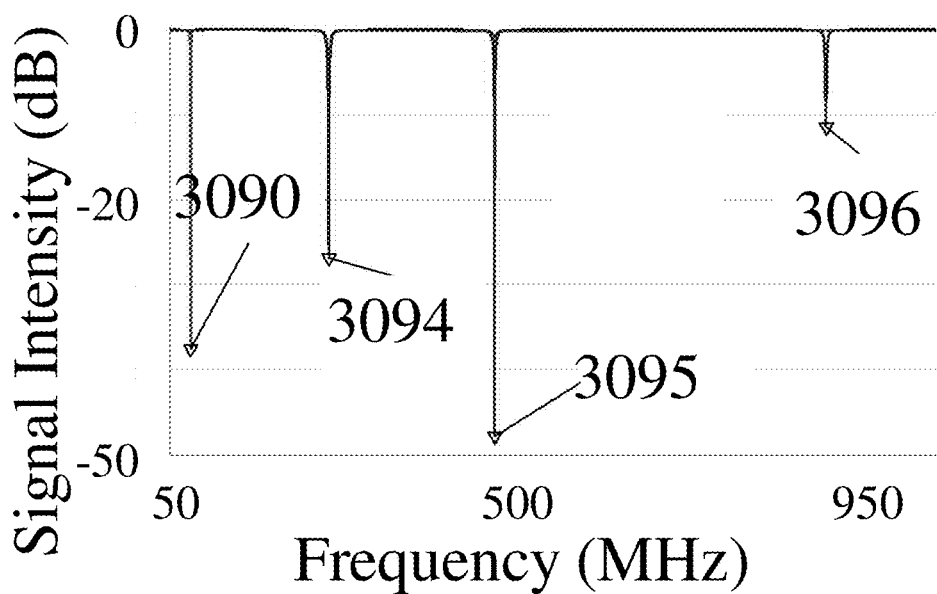
FIG. 4C is a two-port plot overlay simulation showing the signal intensity DB(S11/S22) versus the frequency for $^{19}$F 3095 and $^2$H 3090 based on the circuit shown in FIG. 3B after the frequency has been adjusted using the variable capacitors 1086, 1088, 1022 and 1087 via the leads 1030, 1031 (where the leads 1030, 1031 result in resonances 3094, 3096)
Figure 4D:
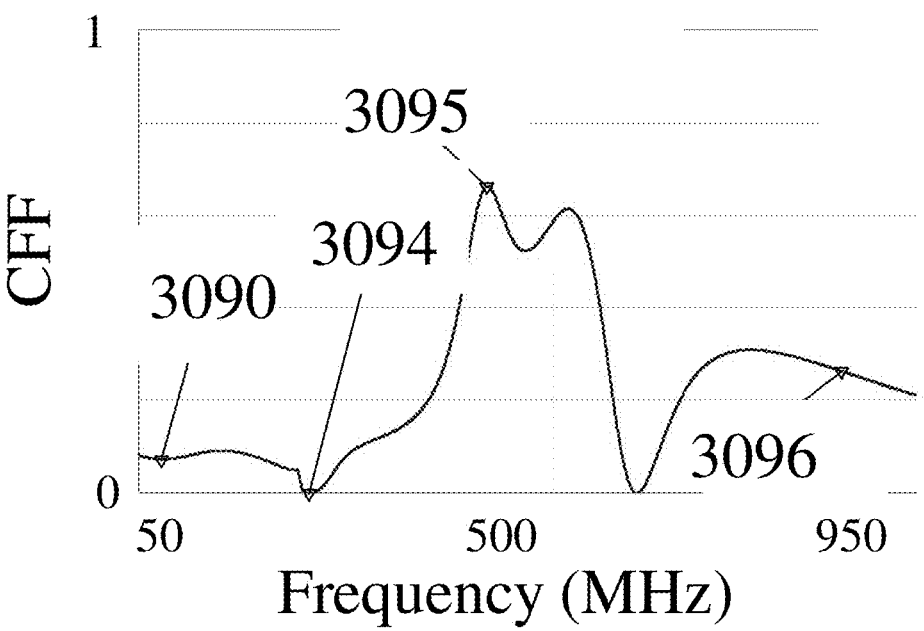
FIG. 4D is a CFF plot versus the frequency for $^{19}$F 3095 and $^2$H 3090 based on the circuit shown in FIG. 3B for the frequency as adjusted in FIG. 4C.

In order to tune the circuit shown in FIG. 3B from $^1$H to $^{19}$F the variable capacitors 1086 and 1022 have to be increased in value to lower the frequency from 500.0 MHz to 470.3 MHz. However, this will cause more current to flow in the leads 1030, 1031 in FIG. 3B because the impedance to ground is lowered. The match at 3081 port 1 for $^1$H can be adjusted slightly using the variable capacitors 1087 but it has almost no effect on the current flowing in the leads or the match. The result of tuning to $^{19}$F is to cause more energy in the circuit to be removed from the parent coil and placed in the leads 1030, 1031 going to the variable capacitors (see FIG. 3B) as shown in FIG. 4C (a two-port plot overlay simulation showing the signal intensity DB(S11/S22) versus the frequency for 3090 $^2$H (76.8 MHz, −37.5 dB), 3094 (255.2 MHz, −26.85 dB), 3095 $^{19}$F (470.3 MHz, −47.77 dB) and 3096 (898.9 MHz, −11.4 dB), based on the circuit shown in FIG. 3B adjusted to detect $^{19}$F (i.e., after the frequency has been adjusted using the variable capacitors 1086, 1088, 1022 and 1087). FIG. 4D is a CFF plot versus the frequency for the circuit shown in FIG. 3B adjusted to detect $^{19}$F (i.e., adjusted as in FIG. 4C) showing 3090 $^2$H (76.8 MHz, CFF=0.0727), 3094 (255.2 MHz, CFF=0.00903), 3095 $^{19}$F (470.3 MHz, CFF=0.6632) and 3096 (898.9 MHz, CFF=0.2634), where the inductance in leads 1030, 1031 in FIG. 3 results in resonances 3094, 3096.

The energy in the parent coil 5010 has dropped from ~76% (3092 in FIG. 4B) to ~66% (3095 in FIG. 4D) while the energy in the leads has increased from ~15% (3091 and 3093 in FIG. 4B) to ~26% (3094 and 3096 in FIG. 4D). The circuit (see FIG. 3B) when tuned to $^{19}$F (see FIG. 4D) is less efficient than when the circuit (see FIG. 3B) is tuned to $^1$H (see FIG. 4B). In an embodiment of the present invention, in order to eliminate the loss associated with the leads (1030, 1031 in FIG. 3B), a sliding band capacitor 5014 (in FIG. 5) replaces the variable capacitors 1086, 1088, 1022 and 1087 (in FIG. 3B) and can be used to tune the circuit in the parent coil.

Figure 6A:
FIG. 6A is a two-port plot overlay simulation showing the signal intensity DB(S11/S22) versus the frequency for $^1$H 3092 and $^2$H 3090 based on the circuit shown in FIG. 5, according to an embodiment of the invention.
Figure 6B:
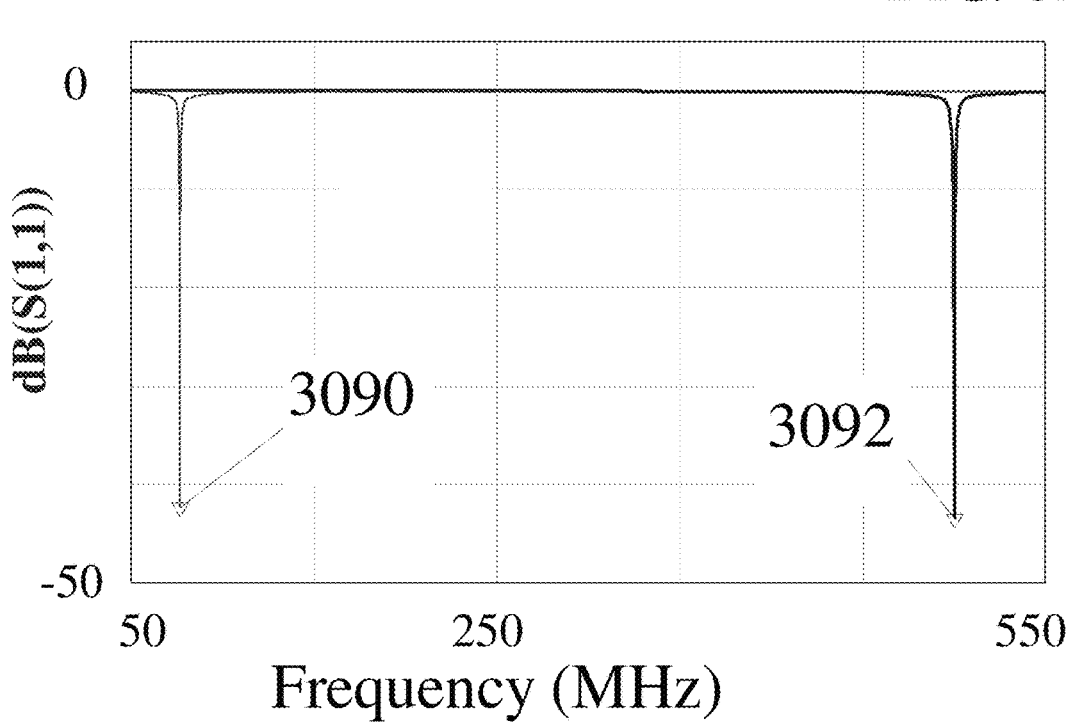
FIG. 6B is a CFF plot versus the frequency for $^1$H 3092 and $^2$H 3090 based on the circuit shown in FIG. 5 for the frequency as adjusted in FIG. 6A, according to an embodiment of the invention.
Figure 6B:
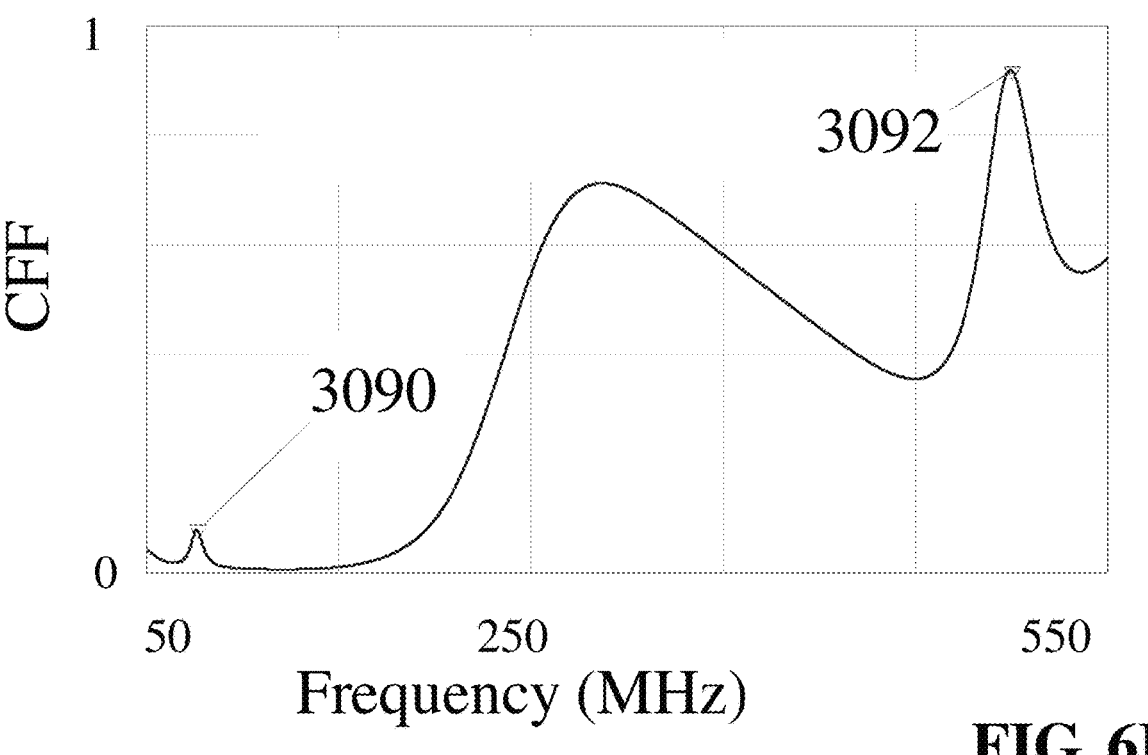
Figures 6C, 6D:
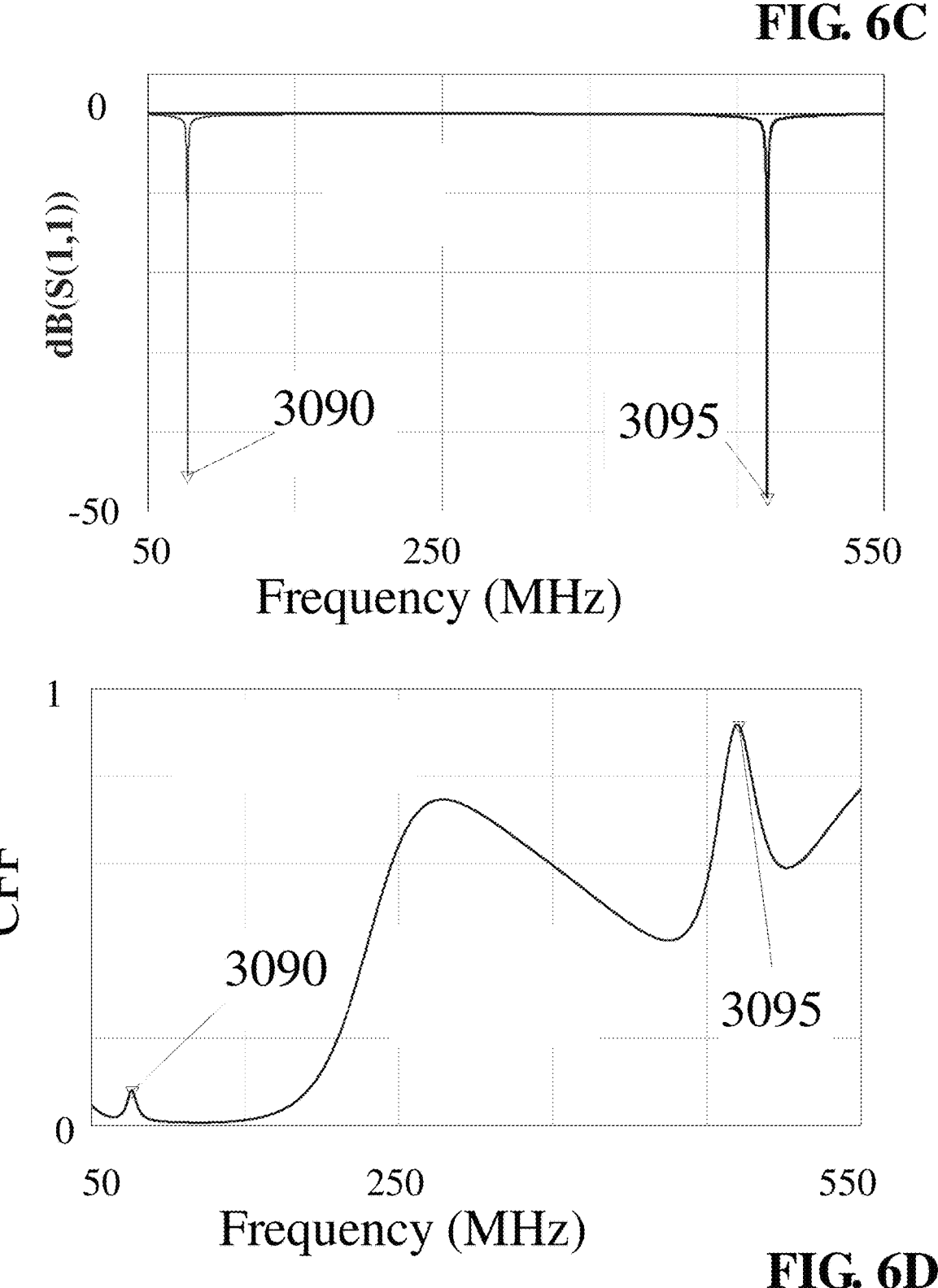
FIG. 6C is a two-port plot overlay simulation showing the signal intensity DB(S11/S22) versus the frequency for $^{19}$F 3095 and $^2$H 3090 based on the circuit shown in FIG. 5 after the frequency has been adjusted using the sliding band capacitor 5014, according to an embodiment of the invention.
FIG. 6D is a CFF plot versus the frequency for $^{19}$F 3095 and $^2$H 3090 based on the circuit shown in FIG. 5 for the frequency as adjusted in FIG. 6C, according to an embodiment of the invention.

For the calculations based on the circuit shown in FIG. 5, the parent coil 5010 has an inductance of 15 nH, the lock inductors 1070, 1071 are assigned inductances of 90 nH, the inductors 3087, 3088 are assigned inductances of 30 nH, the inductor 1088 is assigned an inductances of 50 nH, 1090 signifies ground, resistors 1052, 1054, 1056, 1058 have resistances of 1×10$^{-9}$ Ohms, and capacitors 1022, 1086, 1024, 1025, 1087, and 1026 have capacitances of 47.4 pF, 113.3 pF, 3.7 pF, 21.94 pF, 2.43 pF and 1.422 pF respectively. FIG. 5 is a circuit for a probe in which a sliding band capacitor 5014 comprising zero sum volume magnetic susceptibility materials is used to adjust the resonance of the parent coil. In the process of using the sliding band capacitor 5014 in FIG. 5 it is still necessary to impedance match the circuit to a load (50 Ohms). In FIG. 5 magnetic coupling is used to do this by implementing Secondary Magnetic Coupling. FIG. 6A is a two-port plot overlay simulation showing the signal intensity DB(S11/S22) versus the frequency for $^2$H 3090 (76.8 MHz, −42.3 dB), and 3092 $^1$H (500 MHz, −43.4 dB) based on the circuit shown in FIG. 5 tuned to $^1$H. FIG. 6B is a CFF plot versus the frequency for $^2$H 3090 (76.8 MHz, CFF=0.0805) and $^1$H 3092 (500 MHz, CFF=0.918) and based on the circuit shown in FIG. 5 tuned to $^1$H (i.e., for the frequency as adjusted in FIG. 6A). FIG. 6C is a two-port plot overlay simulation showing the signal intensity DB(S11/S22) versus the frequency for $^2$H 3090 (76.8 MHz, −45.38 dB) and $^{19}$F 3095 (470.3 MHz, −48.18 dB) and based on the circuit shown in FIG. 5 tuned to $^{19}$F (i.e., after the frequency has been adjusted using the sliding band capacitor 5014). FIG. 6D is a CFF plot versus the frequency for $^2$H 3090 (76.8 MHz, CFF=0.0805) and $^{19}$F 3095 (470.3 MHz, CFF=0.9177) based on the circuit shown in FIG. 5 tuned to $^{19}$F (i.e., for the frequency as adjusted in FIG. 6C). Unexpectedly, by eliminating the leads we have eliminated spurious resonances in the S11/S22 plot (see resonances 3091, 3093 in FIG. 4B and resonances 3094, 3096 in FIG. 4D) and importantly increased the energy in the parent coil. Unexpectedly, the energy in the parent coil increases from 76.35% (3092 in FIG. 4B) to 91.8% (3095 in FIG. 6B) for $^1$H observe. For $^{19}$F the energy in the parent coil has increased from 66.32% (3095 in FIG. 4D) to 91.77% (3095 in FIG. 6D).

In a circuit using leads to a variable capacitor the performance when tuned to $^1$H is higher by a factor of 1.1 compared to the performance when tuned to $^{19}$F. Unexpectedly, when a sliding band capacitor 5014 is used in the circuit instead of a circuit using leads to a variable capacitor the performance when tuned to $^{19}$F is higher by a factor of 1.1 compared to the performance when tuned to $^1$H. In an embodiment of the present invention, using a sliding band capacitor 5014 becomes more important for circuits using low inductance sample coils.

Further Embodiments

Embodiments contemplated herein include Embodiments P1-P75 following.

Embodiment P1. A NMR probe adapted to detect a resonance of at least a nucleus from a sample, including a parent coil circuit comprising a parent coil, where the parent coil comprises a non-tapered inner conductance skirt, a cell adapted for holding the sample at a temperature, and (iii) a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the NMR probe is adapted to introduce the sample into a magnetic field of a NMR instrument, where the sliding band capacitor is adapted to physically move relative to the non-tapered inner conductance skirt to adjust an inductance of the parent coil to allow the parent coil to detect the resonance of at least the nucleus from the sample.

Embodiment P2. The NMR probe of embodiment P1, where the at least one paramagnetic metal is adapted to form a paramagnetic metal ring.

Embodiment P3. The NMR probe of embodiment P2, where the paramagnetic metal ring is enclosed by the at least one diamagnetic metal.

Embodiment P4. The NMR probe of embodiment P2, where the paramagnetic metal ring is surrounded by the at least one diamagnetic metal.

Embodiment P5. The NMR probe of embodiment P1, where the at least one paramagnetic metal is selected from the group consisting of aluminum, palladium, platinum, rhodium, tantalum, titanium and tungsten.

Embodiment P6. The NMR probe of embodiment P2, where the paramagnetic metal ring comprises a titanium composition by volume a lower limit of greater than approximately eighty (80) percent, and an upper limit of greater than approximately ninety-eight (98) percent.

Embodiment P7. The NMR probe of embodiment P1, where a RF field symmetry of the magnetic field is minimally affected by a position of the sliding band capacitor moving relative to the non-tapered inner conductance skirt.

Embodiment P8. The NMR probe of embodiment P1, where the sum is a lower limit of approximately $1\times10^{-6}$ at 80° K, and an upper limit of approximately $1\times10^{-5}$ at 80° K.

Embodiment P9. The NMR probe of embodiment P1, where the temperature of the sliding band capacitor is approximately 300° K when the sample is introduced into the NMR instrument, where the temperature of the sliding band capacitor prior to detection of the resonance is reduced to a lower limit of approximately 15° K, and an upper limit of approximately 80° K.

Embodiment P10. The NMR probe of embodiment P1, where the at least one diamagnetic metal has a conductance at 300° K of a lower limit of approximately $1\times10^{7}$ S/m, and an upper limit of approximately $1\times10^{8}$ S/m.

Embodiment P11. The NMR probe of embodiment P1, where the at least one diamagnetic metal is selected from the group consisting of copper, gold, nickel, silver, and zinc.

Embodiment P12. The NMR probe of embodiment P1, where the at least one diamagnetic metal is an alloy, where the alloy comprises copper and silver.

Embodiment P13. The NMR probe of embodiment P1, where the at least one diamagnetic metal is copper.

Embodiment P14. The NMR probe of embodiment P1, where the diamagnetic insulator is selected from the group consisting of sapphire, quartz, diamond, boron nitride, silicon nitride, and alumina.

Embodiment P15. The NMR probe of embodiment P1, where the at least one paramagnetic metal is an alloy, where the alloy comprises aluminum and titanium.

Embodiment P16. The NMR probe of embodiment P1, where a first paramagnetic metal of the at least one paramagnetic metal is titanium.

Embodiment P17. The NMR probe of embodiment P1, where the resonance is selected from the group consisting of $^{1}$H, $^{19}$F, and $^{13}$C.

Embodiment P18. A NMR probe (Nuclear Magnetic Resonance probe) adapted to detect a resonance of at least a nucleus from a sample, including a parent coil circuit comprising a parent coil, where the parent coil comprises a non-tapered inner conductance skirt, a cell adapted for holding the sample, and a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the at least one paramagnetic metal is adapted to form of a paramagnetic metal ring, where the paramagnetic metal ring is enclosed or surrounded by the at least one diamagnetic metal, where the sliding band capacitor is at a temperature, where the temperature is approximately 300° K when the sample is introduced into a NMR instrument, where the temperature prior to detection of the resonance is reduced to a first lower limit of approximately 30° K, a first upper limit of approximately 80° K, where the NMR probe is adapted to introduce the sample into a magnetic field of the NMR instrument, where the sliding band capacitor is adapted to physically move relative to the non-tapered inner conductance skirt to adjust an inductance of the parent coil to allow the parent coil to detect the resonance of at least the nucleus from the sample.

Embodiment P19. The NMR probe of embodiment P18, where the paramagnetic metal ring comprises a titanium composition by volume a second lower limit of greater than approximately eighty (80) percent, and a second upper limit of greater than approximately ninety-eight (98) percent.

Embodiment P20. A method of detecting a resonance of at least a nucleus from a sample using a cooled NMR probe (Nuclear Magnetic Resonance probe), including selecting a parent coil circuit comprising a parent coil, where the parent coil comprises a non-tapered inner conductance skirt, selecting the sample, loading the sample into the cooled NMR probe, introducing the cooled NMR probe into a magnetic field of a NMR instrument, where the parent coil circuit is in electrical contact with the non-tapered inner conductance skirt, where an inductance of the parent coil is adapted to be adjusted by moving a sliding band capacitor relative to the non-tapered inner conductance skirt, where the sliding band capacitor comprises a diamagnetic insulator with a first volume magnetic susceptibility, at least one paramagnetic metal with a second volume magnetic susceptibility and at least one diamagnetic metal with a third volume magnetic susceptibility, where a sum of the first volume magnetic susceptibility and the second volume magnetic susceptibility and the third volume magnetic susceptibility is approximately zero, where a first diamagnetic metal of the at least one diamagnetic metal is selected from the group consisting of copper, gold, nickel, silver, and zinc, where the at least one paramagnetic metal is adapted to form a paramagnetic metal ring, where the paramagnetic metal ring is enclosed or surrounded by the at least one diamagnetic metal, where the sliding band capacitor is adapted to be cooled to a temperature;

(v) spinning the sample, and (vi) exciting the sample with a Radio Frequency (RF) field at a Larmor frequency, where the cooled NMR probe is adapted to introduce the sample into the magnetic field of the NMR instrument, where the sliding band capacitor is adapted to physically move relative to the non-tapered inner conductance skirt to adjust a frequency of the parent coil to allow the parent coil to detect the resonance of the at least the nucleus.

Embodiment P21. The method of embodiment P20, where the temperature is approximately 300° K when the sample is introduced into the NMR instrument, where the temperature prior to detection of the resonance is reduced to a lower limit of approximately 30° K, and an upper limit of approximately 80° K.

Embodiment P22. The method of embodiment P20, where the at least one paramagnetic metal is an alloy, where the alloy comprises aluminum and titanium.

Embodiment P23. The method of embodiment P20, where the paramagnetic metal ring comprises a titanium composition by volume a lower limit of greater than approximately eighty (80) percent, and an upper limit of greater than approximately ninety-eight (98) percent.

Embodiment P24. The NMR probe of embodiment P2, where the paramagnetic metal ring is contacted by the at least one diamagnetic metal Embodiment P25. The NMR probe of embodiment P2, where greater than approximately ninety-eight (98) percent of a surface area of a top edge of the paramagnetic metal ring is aligned with the at least one diamagnetic metal and approximately ninety (90) percent of a surface area of a side of a titanium foil ring is aligned with the at least one diamagnetic metal, where an exposed portion of the side is adjacent a bottom edge.

Embodiment P26. The NMR probe of embodiment P1, where the sliding band capacitor is adapted to be cooled to a lower limit of approximately 5° K, and an upper limit of approximately 100° K.

Embodiment P27. The NMR probe of embodiment P18, where a measured Q value at 500 MHz is greater than 1000.

Embodiment P28. The NMR probe of embodiment P18, where the paramagnetic metal ring is enclosed by the at least one diamagnetic metal.

Embodiment P29. The NMR probe of embodiment P28, where a measured Q value of the paramagnetic metal ring is greater than approximately ninety-five (95) percent of an optimal Q value.

Embodiment P30. The NMR probe of embodiment P29, where approximately ninety-nine (99) percent of the surface area of a top edge of the paramagnetic metal ring is approximately aligned with the at least one diamagnetic metal.

Embodiment P31. The NMR probe of embodiment P29, where approximately ninety-nine (99) percent of the surface area of a side of the paramagnetic metal ring is approximately aligned with the at least one diamagnetic metal.

Embodiment P32. The NMR probe of embodiment P18, where the paramagnetic metal ring is surrounded by the at least one diamagnetic metal.

Embodiment P33. The NMR probe of embodiment P32, where a measured Q value of the paramagnetic metal ring is greater than approximately ninety (90) percent of an optimal Q value.

Embodiment P34. The NMR probe of embodiment P33, where approximately ninety-nine (99) percent of the surface area of a top edge of the paramagnetic metal ring is approximately aligned with the at least one diamagnetic metal.

Embodiment P35. The NMR probe of embodiment P33, where approximately ninety-nine (99) percent of the surface area of a side of the paramagnetic metal ring is approximately aligned with the at least one diamagnetic metal.

Embodiment P36. The NMR probe of embodiment P18, where the at least one paramagnetic metal is selected from the group consisting of aluminum, palladium, platinum, rhodium, tantalum, titanium and tungsten.

Embodiment P37. The NMR probe of embodiment P18, where a RF field symmetry of the magnetic field is minimally affected by a position of the sliding band capacitor moving relative to the non-tapered inner conductance skirt.

Embodiment P38. The NMR probe of embodiment P18, where the sum is a lower limit of approximately $1 \times 10^{-6}$ at 80° K, and an upper limit of approximately $1 \times 10^{-5}$ at 80° K.

Embodiment P39. The NMR probe of embodiment P18, where the at least one diamagnetic metal has a conductance at 300° K of a lower limit of approximately $1 \times 10^7$ S/m, and an upper limit of approximately $1 \times 10^8$ S/m.

Embodiment P40. The NMR probe of embodiment P18, where the at least one diamagnetic metal is selected from the group consisting of copper, gold, nickel, silver, and zinc.

Embodiment P41. The NMR probe of embodiment P18, where the at least one diamagnetic metal is an alloy, where the alloy comprises copper and silver.

Embodiment P42. The NMR probe of embodiment P18, where the at least one diamagnetic metal is copper.

Embodiment P43. The NMR probe of embodiment P18, where the diamagnetic insulator is selected from the group consisting of sapphire, quartz, diamond, boron nitride, silicon nitride, and alumina.

Embodiment P44. The NMR probe of embodiment P18, where the at least one paramagnetic metal is an alloy, where the alloy comprises aluminum and titanium.

Embodiment P45. The NMR probe of embodiment P18, where a first paramagnetic metal of the at least one paramagnetic metal is titanium.

Embodiment P46. The NMR probe of embodiment P18, where the resonance is selected from the group consisting of $^{1}H$, $^{19}F$, and $^{13}C$.

Embodiment P47. The method of embodiment P20, where a measured Q value at 500 MHz is greater than 1000.

Embodiment P48. The method of embodiment P20, where the paramagnetic metal ring is enclosed by the at least one diamagnetic metal.

Embodiment P49. The method of embodiment P48, where a measured Q value of the paramagnetic metal ring is greater than approximately ninety-five (95) percent of an optimal Q value.

Embodiment P50. The method of embodiment P49, where approximately ninety-nine (99) percent of the surface area of a top edge of the paramagnetic metal ring is approximately aligned with the at least one diamagnetic metal.

Embodiment P51. The method of embodiment P49, where approximately ninety-nine (99) percent of the surface area of a side of the paramagnetic metal ring is approximately aligned with the at least one diamagnetic metal.

Embodiment P52. The method of embodiment P20, where the paramagnetic metal ring is surrounded by the at least one diamagnetic metal.

Embodiment P53. The method of embodiment P52, where a measured Q value of the paramagnetic metal ring is greater than approximately ninety (90) percent of an optimal Q value.

Embodiment P54. The method of embodiment P53, where approximately ninety-nine (99) percent of the surface area of a top edge of the paramagnetic metal ring is approximately aligned with the at least one diamagnetic metal.

Embodiment P55. The method of embodiment P53, where approximately ninety-five (95) percent of the surface area of a side of the paramagnetic metal ring is approximately aligned with the at least one diamagnetic metal.

Embodiment P56. The method of embodiment P20, where the at least one paramagnetic metal is selected from the group consisting of aluminum, palladium, platinum, rhodium, tantalum, titanium and tungsten.

Embodiment P57. The method of embodiment P20, where the paramagnetic metal ring comprises a titanium composition by volume a lower limit of greater than approximately eighty (80) percent, and an upper limit of greater than approximately ninety-eight (98) percent.

Embodiment P58. The method of embodiment P20, where a RF field symmetry of the magnetic field is minimally affected by a position of the sliding band capacitor moving relative to the non-tapered inner conductance skirt.

Embodiment P59. The method of embodiment P20, where the sum is a lower limit of approximately $1 \times 10^{-6}$ at 80° K, and an upper limit of approximately $1 \times 10^{-5}$ at 80° K.

Embodiment P60. The method of embodiment P20, where the at least one diamagnetic metal has a conductance at 300° K of a lower limit of approximately $1 \times 10^7$ S/m, and an upper limit of approximately $1 \times 10^8$ S/m.

Embodiment P61. The method of embodiment P20, where the at least one diamagnetic metal is selected from the group consisting of copper, gold, nickel, silver, and zinc.

Embodiment P62. The method of embodiment P20, where the at least one diamagnetic metal is an alloy, where the alloy comprises copper and silver.

Embodiment P63. The method of embodiment P20, where the at least one diamagnetic metal is silver.

Embodiment P64. The method of embodiment P20, where the at least one diamagnetic metal is copper.

Embodiment P65. The method of embodiment P20, where the diamagnetic insulator is selected from the group consisting of quartz, diamond, boron nitride, silicon nitride, and alumina.

Embodiment P66. The method of embodiment P20, where the diamagnetic insulator is sapphire.

Embodiment P67. The method of embodiment P20, where the at least one paramagnetic metal is selected from the group consisting of aluminum and titanium.

Embodiment P68. The method of embodiment P20, where the at least one paramagnetic metal is an alloy, where the alloy comprises aluminum and titanium.

Embodiment P69. The method of embodiment P20, where the non-tapered skirt comprises a metal or an alloy.

Embodiment P70. The method of embodiment P69, where the metal is copper.

Embodiment P71. The method of embodiment P69, where the alloy is selected from the group consisting of Cu plated with Pd, and a Cu—Al—Cu alloy.

Embodiment P72. The method of embodiment P20, where a first paramagnetic metal of the at least one paramagnetic metal is titanium.

Embodiment P73. The method of embodiment P20, where the resonance is selected from the group consisting of $^1$H, $^{19}$F, and $^{13}$C.

Embodiment P74. A NMR probe adapted to detect a resonance of at least a nucleus from a sample, including, a parent coil circuit comprising a parent coil, where the parent coil comprises a non-tapered inner conductance skirt, a cell adapted for holding the sample at a temperature, and a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the NMR probe is adapted to introduce the sample into a magnetic field of a NMR instrument, where the paramagnetic metal ring is contacted by the at least one diamagnetic metal, where greater than approximately ninety-eight (98) percent of a surface area of a top edge of the paramagnetic metal ring is aligned with the at least one diamagnetic metal and approximately ninety (90) percent of a surface area of a side of a titanium foil ring is aligned with the at least one diamagnetic metal, where an exposed portion of the side is adjacent a bottom edge, where the sliding band capacitor is adapted to be cooled to between a lower limit of approximately 5° K, and an upper limit of approximately 100° K, where the sliding band capacitor is adapted to physically move relative to the non-tapered inner conductance skirt to adjust an inductance of the parent coil to allow the parent coil to detect the resonance of at least the nucleus from the sample.

Embodiment P75. A NMR probe adapted to detect a resonance of at least a nucleus from a sample, including, a parent coil circuit comprising a parent coil, where the parent coil comprises a non-tapered inner conductance skirt, a cell adapted for holding the sample at a temperature, and a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the NMR probe is adapted to introduce the sample into a magnetic field of a NMR instrument, where the at least one paramagnetic metal forms is adapted to form a paramagnetic metal ring, where paramagnetic metal ring is aligned with the at least one diamagnetic metal such that the measured Q value is greater than approximately ninety-five (95) percent of the optimal Q value, where the sliding band capacitor is adapted to be cooled to between a lower limit of approximately 5° K, and an upper limit of approximately 100° K, where the sliding band capacitor is adapted to physically move relative to the non-tapered inner conductance skirt to adjust an inductance of the parent coil to allow the parent coil to detect the resonance of at least the nucleus from the sample.

Abbreviations: Circuit Fill Factor=CFF; Circuit Fill Factor for a specific mode, k, referred to a reference inductor, a=$\mathrm{CFF}_{k,a}$; Magnetic Field=$B_1$; Nuclear Magnetic Resonance=NMR; Quality Factor=Q; Quality factor for a resonator k=$Q_k$; Radio Frequency=RF; Sample Fill Factor=SFF; Signal to Noise Ratio=SNR; Static Magnetic Field=$B_0$; Unloaded Q=$Q_u$.

While the systems, methods, and devices have been illustrated by the described examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and devices provided herein. Additional advantages and modifications will readily be apparent to those skilled in the art. Therefore, the invention, in its broader aspects, is not limited to the specific details, the representative system, method or device, and illustrative examples shown and described. Accordingly, departures may be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

The invention claimed is:

1. A NMR (Nuclear Magnetic Resonance) probe adapted to detect a resonance of at least a nucleus from a sample, comprising:

(i) a parent coil circuit comprising a parent coil, where the parent coil comprises a non-tapered inner conductance skirt;

(ii) a cell adapted for holding the sample at a temperature; and (iii) a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the NMR probe is adapted to introduce the sample into a magnetic field of a NMR instrument, where the sliding band capacitor is adapted to physically move relative to the non-tapered inner conductance skirt to adjust an inductance of the parent coil to allow the parent coil to detect the resonance of at least the nucleus from the sample.

2. The NMR probe of claim 1, where the at least one paramagnetic metal is adapted to form a paramagnetic metal ring.

3. The NMR probe of claim 2, where the paramagnetic metal ring is enclosed by the at least one diamagnetic metal.

4. The NMR probe of claim 2, where the paramagnetic metal ring is surrounded by the at least one diamagnetic metal.

5. The NMR probe of claim 2, where the paramagnetic metal ring comprises a titanium composition by volume between:

a lower limit of greater than approximately eighty (80) percent; and an upper limit of greater than approximately ninety-eight (98) percent.

6. The NMR probe of claim 1, where the at least one paramagnetic metal is selected from the group consisting of aluminum, palladium, platinum, rhodium, tantalum, titanium and tungsten.

7. The NMR probe of claim 1, where a RF field symmetry of the magnetic field is minimally affected by a position of the sliding band capacitor moving relative to the non-tapered inner conductance skirt.

8. The NMR probe of claim 1, where the sum is between:

a lower limit of approximately $1 \times 10^{-6}$ at 80° K; and an upper limit of approximately $1 \times 10^{-5}$ at 80° K.

9. The NMR probe of claim 1, where the temperature of the sliding band capacitor is approximately 300° K when the sample is introduced into the NMR instrument, where the temperature of the sliding band capacitor prior to detection of the resonance is reduced to between:

a lower limit of approximately 15° K; and an upper limit of approximately 80° K.

10. The NMR probe of claim 1, where the at least one diamagnetic metal has a conductance at 300° K of between:

a lower limit of approximately $1 \times 10^{7}$ S/m; and an upper limit of approximately $1 \times 10^{8}$ S/m.

11. The NMR probe of claim 1, where the at least one diamagnetic metal is selected from the group consisting of copper, gold, nickel, silver, and zinc.

12. The NMR probe of claim 1, where the at least one diamagnetic metal is an alloy, where the alloy comprises copper and silver.

13. The NMR probe of claim 1, where the at least one diamagnetic metal is copper.

14. The NMR probe of claim 1, where the diamagnetic insulator is selected from the group consisting of sapphire, quartz, diamond, boron nitride, silicon nitride, and alumina.

15. The NMR probe of claim 1, where the at least one paramagnetic metal is an alloy, where the alloy comprises aluminum and titanium.

16. The NMR probe of claim 1, where a first paramagnetic metal of the at least one paramagnetic metal is titanium.

17. The NMR probe of claim 1, where the resonance is selected from the group consisting of $^{1}$H, $^{19}$F, and $^{13}$C.

18. A NMR (Nuclear Magnetic Resonance) probe adapted to detect a resonance of at least a nucleus from a sample, comprising:

(i) a parent coil circuit comprising a parent coil, where the parent coil comprises a non-tapered inner conductance skirt;

(ii) a cell adapted for holding the sample; and (iii) a sliding band capacitor comprising a diamagnetic insulator with a first volume magnetic susceptibility, at least one paramagnetic metal with a second volume magnetic susceptibility, and at least one diamagnetic metal with a third volume magnetic susceptibility, where a sum of the first volume magnetic susceptibility and the second volume magnetic susceptibility and the third volume magnetic susceptibility is approximately zero, where the at least one paramagnetic metal is adapted to form of a paramagnetic metal ring, where the paramagnetic metal ring is enclosed or surrounded by the at least one diamagnetic metal, where the sliding band capacitor is at a temperature, where the temperature is approximately 300° K when the sample is introduced into a NMR instrument, where the temperature prior to detection of the resonance is reduced to between:

a first lower limit of approximately 30° K;

a first upper limit of approximately 80° K, where the NMR probe is adapted to introduce the sample into a magnetic field of the NMR instrument, where the sliding band capacitor is adapted to physically move relative to the non-tapered inner conductance skirt to adjust an inductance of the parent coil to allow the parent coil to detect the resonance of at least the nucleus from the sample.

19. The NMR probe of claim 18, where the paramagnetic metal ring comprises a titanium composition by volume between:

a second lower limit of greater than approximately eighty (80) percent; and a second upper limit of greater than approximately ninety-eight (98) percent.

20. A method of detecting a resonance of at least a nucleus from a sample using a cooled NMR probe (Nuclear Magnetic Resonance probe), comprising:

(i) selecting a parent coil circuit comprising a parent coil, where the parent coil comprises a non-tapered inner conductance skirt;

(ii) selecting the sample;

(iii) loading the sample into the cooled NMR probe;

(iv) introducing the cooled NMR probe into a magnetic field of a NMR instrument, where the parent coil circuit is in electrical contact with the non-tapered inner conductance skirt, where an inductance of the parent coil is adapted to be adjusted by moving a sliding band capacitor relative to the non-tapered inner conductance skirt, where the sliding band capacitor comprises a diamagnetic insulator with a first volume magnetic susceptibility, at least one paramagnetic metal with a second volume magnetic susceptibility and at least one diamagnetic metal with a third volume magnetic susceptibility, where a sum of the first volume magnetic susceptibility and the second volume magnetic susceptibility and the third volume magnetic susceptibility is approximately zero, where a first diamagnetic metal of the at least one diamagnetic metal is selected from the group consisting of copper, gold, nickel, silver, and zinc, where the at least one paramagnetic metal is adapted to form a paramagnetic metal ring, where the paramagnetic metal ring is enclosed or surrounded by the at least one diamagnetic metal, where the sliding band capacitor is adapted to be cooled to a temperature;

(v) spinning the sample; and (vi) exciting the sample with a Radio Frequency (RF) field at a Larmor frequency, where the cooled NMR probe is adapted to introduce the sample into the magnetic field of the NMR instrument, where the sliding band capacitor is adapted to physically move relative to the non-tapered inner conductance skirt to adjust a frequency of the parent coil to allow the parent coil to detect the resonance of the at least the nucleus.

\* \* \* \* \*